(12) United States Patent
Yoshizumi et al.

(10) Patent No.: US 8,018,029 B2
(45) Date of Patent: Sep. 13, 2011

(54) GALLIUM NITRIDE-BASED EPITAXIAL WAFER AND METHOD OF FABRICATING EPITAXIAL WAFER

(75) Inventors: Yusuke Yoshizumi, Itami (JP); Masaki Ueno, Itami (JP); Takao Nakamura, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 105 days.

(21) Appl. No.: 12/565,290

(22) Filed: Sep. 23, 2009

(65) Prior Publication Data

US 2010/0078648 A1 Apr. 1, 2010

(30) Foreign Application Priority Data

Sep. 26, 2008 (JP) ................ P2008-248803

(51) Int. Cl.
*H01L 29/20* (2006.01)
*H01L 33/00* (2006.01)

(52) U.S. Cl. ............... 257/615; 257/79; 257/E33.025

(58) Field of Classification Search ............ 257/76, 257/13, 94, E21.09, E29.008, 615, 79, E33.025; 438/478, 47, 22
See application file for complete search history.

(56) References Cited

U.S. PATENT DOCUMENTS

| | | |
|---|---|---|
| 2003/0160229 A1 | 8/2003 | Narayan et al. |
| 2005/0023544 A1 | 2/2005 | Shibata |
| 2007/0176199 A1 | 8/2007 | Shibata |
| 2008/0017099 A1 | 1/2008 | Onomura et al. |
| 2010/0102297 A1 | 4/2010 | Yoshizumi et al. |

FOREIGN PATENT DOCUMENTS

| | | |
|---|---|---|
| EP | 2 131 388 A1 | 12/2009 |
| JP | 10-12554 A | 1/1998 |
| JP | 2004-128452 A | 4/2004 |
| JP | 2005-159047 | 6/2005 |
| JP | 2005-206424 A | 8/2005 |
| JP | 2005-210053 A | 8/2005 |
| JP | 4232837 | 12/2008 |
| JP | 2009-283588 A | 12/2009 |

OTHER PUBLICATIONS

Ju et al., "High brightness InGaN/GaN blue light emitting diode realized by a 6 × 2" MOCVD system, Japanese Journal of Applied Physics, vol. 44, No. 4B, pp. 2506-2508 (2005).

Kadinski et al., "Computational analysis of GaN/InGaN deposition in MOCVD vertical rotating disk reactors", Journal of Crystal Growth, vol. 261, pp. 175-181 (2004).

Narayan et al., "Effect of thickness variation in high-efficiency InGaN/GaN light-emitting diodes", Applied Physics Letters, vol. 81, No. 5, pp. 841-843 (2002).

*Primary Examiner* — Thomas L Dickey
*Assistant Examiner* — Nikolay Yushin
(74) *Attorney, Agent, or Firm* — Venable LLP; Michael A. Sartori; Leigh D. Thelen

(57) ABSTRACT

A gallium nitride-based epitaxial wafer for a nitride light-emitting device comprises a gallium nitride substrate having a primary surface, a gallium nitride-based semiconductor film provided on the primary surface, and, an active layer provided on the semiconductor film, the active layer having a quantum well structure. A normal line of the primary surface and a C-axis of the gallium nitride substrate form an off angle with each other. The off angle monotonically increases on the line that extends from one point to another point through a center point of the primary surface. The one point and the other point are on an edge of the primary surface, and indium contents of the well layer defined at n points on the line monotonically decrease in a direction from the one point to the other point. The thickness values of the well layer defined at the n points monotonically increase in the direction.

15 Claims, 19 Drawing Sheets

Fig.1
(a)
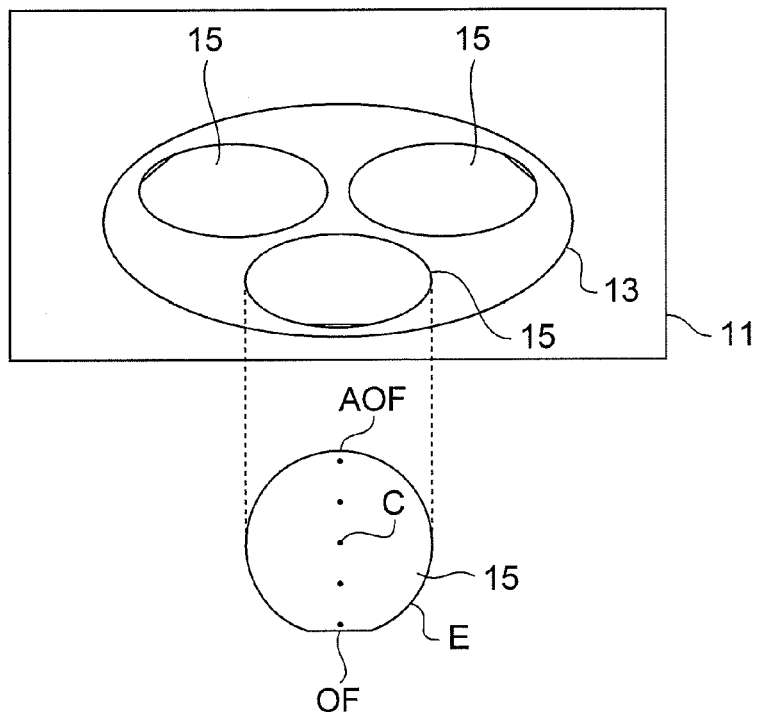
(b)
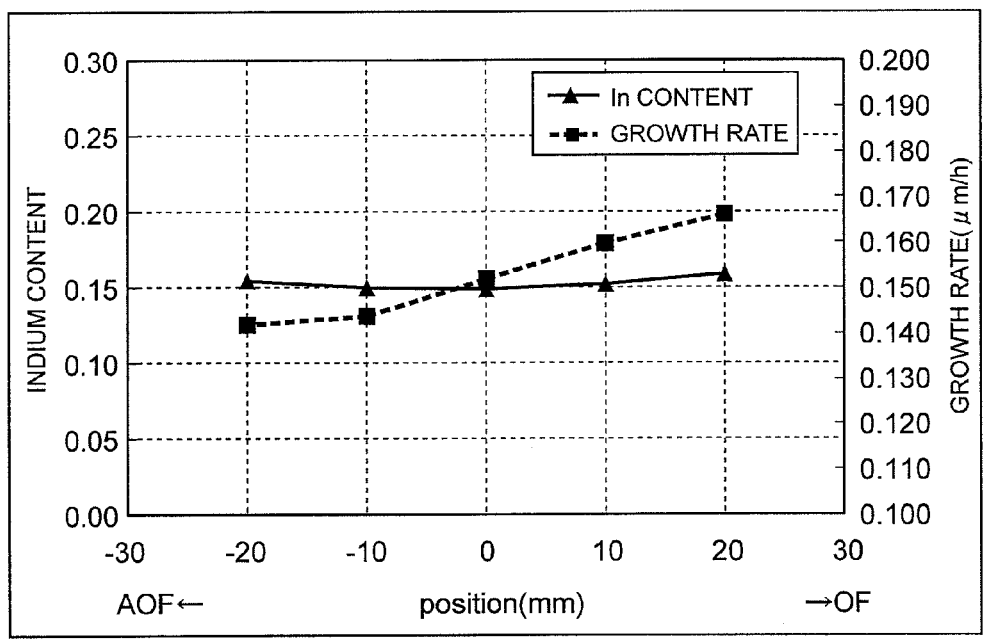

Fig.14
(a)
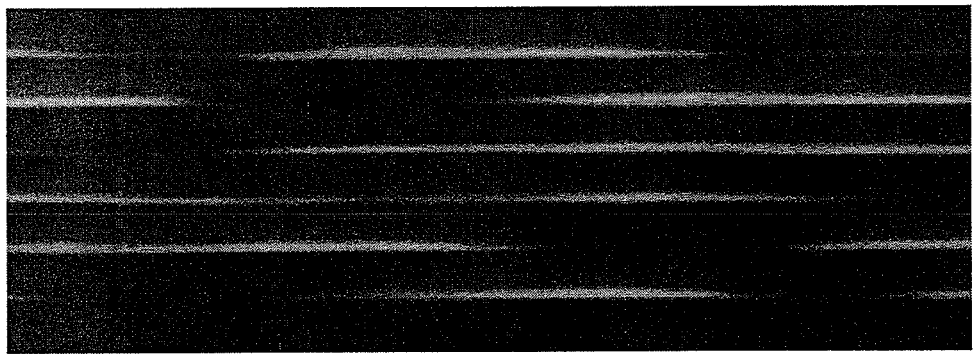
(b)
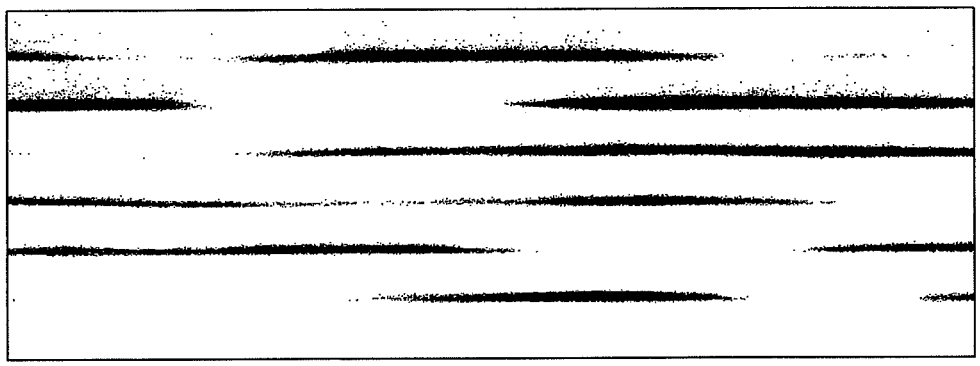

GALLIUM NITRIDE-BASED EPITAXIAL WAFER AND METHOD OF FABRICATING EPITAXIAL WAFER

TECHNICAL FIELD

The present invention relates to a gallium nitride-based epitaxial wafer and a method of fabricating an epitaxial wafer for a gallium nitride-based semiconductor light-emitting device.

BACKGROUND ART

Patent Literature 1 (Japanese Unexamined Patent Application Publication No. 2005-159047) discloses a gallium nitride-based semiconductor device including a gallium nitride-based semiconductor layer with high crystal quality. The gallium nitride-based semiconductor layer is provided on a primary surface of a gallium nitride support of a semiconductor light-emitting device. The normal line of the primary surface and the C-axis of the gallium nitride support form an angle (referred to as "off angle") with each other. When the off angle of the gallium nitride support is close to zero, the surface of the gallium nitride-based semiconductor layer has a hexagonal pyramidal morphology, and the off angle is less than 2 degrees.

SUMMARY OF INVENTION

According to teachings of the inventors, when gallium nitride-based semiconductor light-emitting devices, e.g., light-emitting diodes, including a gallium nitride-based semiconductor well layer including indium as a Group III element, such as an InGaN well layer, are fabricated on gallium nitride substrates, the emission wavelength of the gallium nitride-based semiconductor light-emitting devices has a distribution. In contrast, when light-emitting diodes including an active layer with the same quantum well structure as above are fabricated on sapphire substrates, the emission wavelength of the light-emitting diodes has a relatively narrow distribution as compared therewith. This comparison shows that use of the gallium nitride substrate makes a emission peak wavelength distribution broad in the gallium nitride-based semiconductor light-emitting device.

The inventors conducted various experiments to find the cause of the distribution and studied to narrow the width of the distribution.

It is an object to provide a method of fabricating an epitaxial wafer for a gallium nitride-based semiconductor light-emitting device having a structure that can narrow the distribution of emission wavelength of an active layer including a well layer formed on a gallium nitride substrate, and it is another object to provide a gallium nitride-based epitaxial wafer for such a semiconductor device.

One aspect of the present invention is a gallium nitride-based epitaxial wafer for a nitride light-emitting device. The gallium nitride-based epitaxial wafer comprises (a) a gallium nitride substrate having a primary surface, (b) at least one gallium nitride-based semiconductor film provided on the primary surface of the gallium nitride substrate; and (c) an active layer provided on the gallium nitride-based semiconductor film, the active layer having a quantum well structure. The active layer includes a well layer of a gallium nitride-based semiconductor, and the gallium nitride-based semiconductor contains indium as a Group III element. The normal line of the primary surface and a C-axis of the gallium nitride substrate form an off angle with each other. The off angle distributes on the primary surface. The off angle monotonically increases on the line that extends from one point to another point through a center point of the primary surface of the gallium nitride substrate, the one point and the other point are on an edge of the primary surface. Indium contents of the well layer defined at n points (n: integer) on the line monotonically decreases in a direction from the one point to the other point, and the thickness values of the well layer defined at the n points monotonically increases in the direction.

Another aspect of the present invention provides a method of fabricating an epitaxial wafer for a nitride semiconductor light-emitting device. The method includes the steps of (a) growing a first gallium nitride-based semiconductor film on a primary surface of each of a plurality of gallium nitride substrates, the gallium nitride substrates being located on a susceptor of an organometallic vapor phase epitaxy reactor; (b) growing an active layer on the first gallium nitride-based semiconductor film in the organometallic vapor phase epitaxy reactor while supplying raw material gas, the active layer having a quantum well structure; and (c) growing a second gallium nitride-based semiconductor film on the active layer in the organometallic vapor phase epitaxy reactor. One of the first gallium nitride-based semiconductor film and the second gallium nitride-based semiconductor film is doped with n-type dopant, whereas another of the first gallium nitride-based semiconductor film and the second gallium nitride-based semiconductor film is doped with p-type dopant. The active layer includes a well layer of a gallium nitride-based semiconductor, and the gallium nitride-based semiconductor contains indium as a Group III element. The normal line of the primary surface and a C-axis of each gallium nitride substrate form an off angle with each other. The off angle distributes over the primary surface, and the off angle monotonically varies along the line that extends from one point to another point. The one point and the other point are on an edge of the primary surface through a center point of the primary surface of the gallium nitride substrate, and the off angle at the one point on the edge is larger than that at the other point of the primary surface. The well layer is grown with rotation of the susceptor, and the rotation of the susceptor and flow of raw material gas along a flow axis from upstream to downstream of the raw material gas causes a distribution of a growth rate of the well layer. The distribution has a large growth rate at the one point and the distribution has a small growth rate at the other point.

According to the studies that the inventors have conducted, the indium content is affected by the distribution of the off angle on the primary surface of the substrate. The effect of the off angle distribution is unavoidable in growing a gallium nitride-based semiconductor. Experimental results by the inventors, however, show that partially cancels the effect of the off angle of a gallium nitride substrate having a controlled distribution of the off angle of the primary surface can be partially cancelled in combination with the flow of the raw material gas.

Although crystal growth for a gallium nitride-based epitaxial wafer in a reactor may lead to a broad distribution of the emission wavelength due to the effect of the flow of the raw material gas. The experimental results by the inventors show that the flow is not major effect. As a result of intensive experiments and discussions focusing attention on a difference between a sapphire substrate and a gallium nitride substrate, the inventors has found the following: An off angle defined by the normal line of the primary surface and the C-axis of the sapphire substrate ranges from −0.1 degree to +0.1 degree with respect to an off angle of 0.15 degree at the center of the substrate. On the other hand, an off angle defined by the normal line of the primary surface and the C-axis of the gallium nitride substrate is entirely distributed over the primary surface due to the fabricating process of the gallium nitride substrate.

As described above, the utilization of the controlled off-angle distribution for the gallium nitride-based epitaxial wafer yields a monotonic variation of the off angle on the line that passes through the center of the wafer and extends from the first point on the edge of the primary surface to the second point on the edge. When the "n" points are defined in this gallium nitride substrate and are arranged in sequence on the line, the "n" thickness values of the well layer defined at the "n" points monotonically increase on the line. Besides, the "n" indium contents of the well layer defined at the "n" points monotonically decrease on the line. In this epitaxial wafer, the use of the gallium nitride substrate leads to a narrow distribution of the emission wavelength of the active layer.

In the method of fabricating the epitaxial wafer, as is described above, the uniformity of crystal growth can be improved by rotation of the susceptor. In addition, the effect of an asymmetric or uneven flow of the raw material gas can be averaged by the revolution of the substrates located on the susceptor. The combination of the growth rate distribution and the controlled off-angle distribution leads to a narrow distribution of the emission wavelength of the active layer including the well layer provided on the gallium nitride substrate, the off angle of which monotonically varies on the line that passes through the center of the wafer from the first point on the edge of the primary surface to the second point on the edge.

In the present invention, plural nitride semiconductor light-emitting devices are arranged along the line, and each of the nitride semiconductor light-emitting device includes at least one of "n" points. According to the present invention, the emission wavelength distribution of the active layer for the nitride semiconductor light-emitting device can be narrowed.

In the present invention, the thickness values can be average values at around the "n" points. The average values can be defined by the value "S/L" where "L" represents a predetermined width in a direction perpendicular to the axis extending from the gallium nitride substrate to the active layer, and "S" represents a cross-sectional area of the well layer defined by am image showing a cross-section of the well layer having the predetermined width "L."

In the present invention, the off angle at the first point on the primary surface is smaller than that at the second point on the primary surface. The thickness of the well layer on the first point is smaller than that of the well layer on the second point. The first point and the second point are located on separate nitride semiconductor light-emitting devices.

The direction of the line on the gallium nitride-based epitaxial wafer of the present invention can be directed to the crystal orientation <1-100> or <11-20>. Such crystal orientation is preferred in combination of the off-angle distribution and the well width distribution.

In a preferred embodiment of the gallium nitride-based epitaxial wafer of the present invention, the gallium nitride substrate includes an orientation flat and a substantially circular edge. The direction of the orientation flat may correspond to the crystal orientation <1-100> or <11-20>. In another preferred embodiment of the gallium nitride-based epitaxial wafer of the present invention, the gallium nitride substrate may include a substantially circular edge, and may further include a marker which corresponds to the crystal orientation <1-100> or <11-20>.

In the gallium nitride-based epitaxial wafer of the present invention, the difference between the maximum value and the minimum value of the off-angle distribution on the axis passing through the center of the primary surface of the gallium nitride substrate is preferably less than or equal to 0.7 degree. Such a range is preferred in combination of the off-angle distribution and the well width distribution.

In a preferred embodiment of the fabricating method according to the present invention, the raw material gas for forming the active layer flows in the direction of traverse from one end to the opposite end of the primary surface of the susceptor in the organometallic vapor phase epitaxy reactor. The flow of the raw material gas creates the growth rate distribution of the well layer in the active layer in the direction of the flow.

This flow of the raw material gas can be applied to a gallium nitride substrate whose off angle monotonically varies on the line extending from the first point on the edge of the primary surface to the second point on the edge.

The fabricating method of the present invention further includes the step of providing the gallium nitride substrates on the susceptor. The line of each gallium nitride substrate is oriented in the direction of the predetermined axis.

Arranging a plurality of gallium nitride substrates on the susceptor in the organometallic vapor phase epitaxy reactor with the above orientation can reduce the effect of the off-angle distribution by use of the flow of the raw material gas.

In another preferred embodiment of the fabricating method of the present invention, the raw material gas to form the active layer is flown in the direction of the axis intersecting the primary surface of the susceptor. The flow of the raw material gas causes a growth rate distribution of the well layer in the active layer in the direction of the flow of the raw material gas from upstream to downstream.

This growth rate distribution can be combined with a gallium nitride substrate whose off angle monotonically varies on the line extending from the first point to the second point on the edge of the primary surface.

In the fabricating method of the present invention, the susceptor has a plurality of guides arranged on a circumference defined on the primary surface of the susceptor, for positioning gallium nitride substrates. On the primary surface of the susceptor, the line of each gallium nitride substrate is oriented in the direction intersecting the tangent line of the circumference. This intersecting angle is, for example, a right angle.

Arranging a plurality of gallium nitride substrates on the susceptor in the organometallic vapor phase epitaxy reactor with the above orientation can reduce the effect of the off-angle distribution by use of the flow of the raw material gas.

In the fabricating method of the present invention, the center point of the gallium nitride substrate is located on the circumference defined on the susceptor. The tangent line at the center point intersects the line defined on the gallium nitride substrate. These two lines are preferably orthogonal.

The above object and other objects, features, and advantages of the present invention will be made more apparent from embodiments of the present invention described with reference to the accompanying drawings.

BRIEF DESCRIPTION OF DRAWINGS

FIG. 1 shows a schematic view and a graph for growth of an InGaN active layer using a sapphire substrate.

FIG. 14 shows an image and its binarized image displayed on a processor.

DESCRIPTION OF EMBODIMENTS

Figure 2:
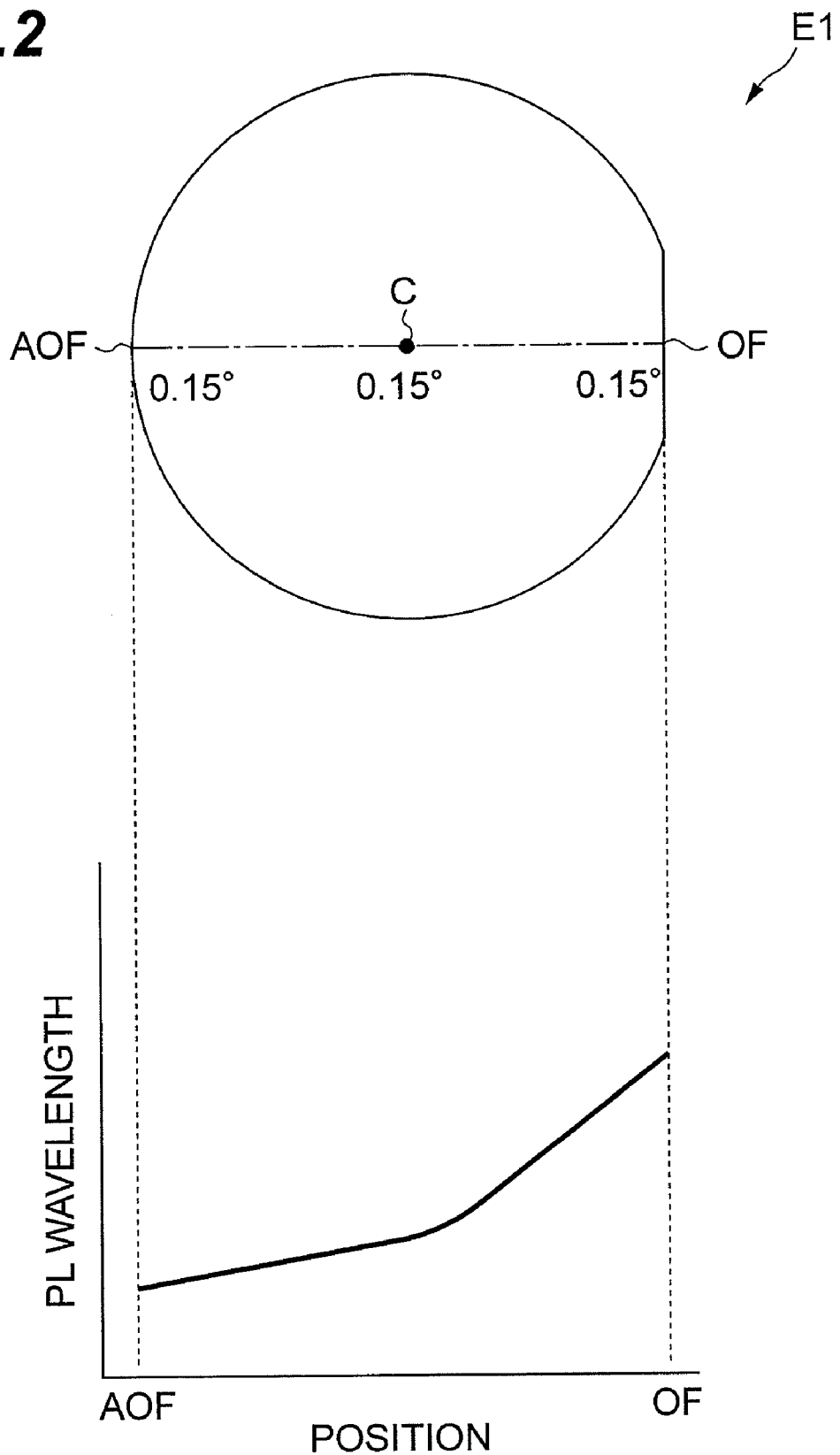
FIG. 2 is a schematic view showing a photoluminescence (PL) wavelength distribution of an epitaxial substrate "E1" on the line from point "OF" to point "AOF."

The teachings of the present invention will be readily understood through the following detailed description with reference to the accompanying drawings shown as examples. Embodiments according to a gallium nitride-based epitaxial wafer and a method of fabricating an epitaxial wafer and a gallium nitride-based semiconductor light-emitting device according to the present invention will be described with reference to the accompanying drawings. The same elements are designated by the same reference numerals, if possible.

First Embodiment

FIG. 1 includes a schematic view and a graph for illustrating a growth of an InGaN active layer on a sapphire substrate. Part (a) of FIG. 1 shows sapphire substrates 15 loaded on a susceptor 13 of an organometallic vapor phase epitaxy reactor 11. The sapphire substrates 15 are located such that each orientation flat (hereinafter referred to simply as "OF") thereof is oriented toward the edge of the susceptor 13. Part (b) of FIG. 1 shows the measurement result of the indium content and growth rate of an InGaN layer at five points which are on an axis passing" from "OF" of the sapphire substrate 15 through the center point "C. In Part (b) of FIG. 1, "AOF" represents an intersecting point between the axis and the edge of the substrate. As shown in Part (b) of FIG. 1, the indium content slightly increases from the center point "C" toward an edge E of the substrates, but the indium content is substantially constant on the primary surface of the substrate. This behavior of the indium content results from the fact that the primary surface of the sapphire substrate has no off-angle distribution. On the other hand, the growth rate of the InGaN layer monotonically increases from "AOF" to "OF." This behavior of the growth rate is associated with the flow of raw materials (raw materials flow from upstream to downstream of a follow channel) in the epitaxy reactor.

An increase in the growth rate leads to an increase in the thickness of the well layer, and this thickness increase in the well layer and an increase in the indium content make the PL wavelength longer as compared with an expected value.

As described below, the inventors fabricate a light-emitting device, for example, a light-emitting diode, using a gallium nitride-based semiconductor by organometallic vapor phase epitaxy. Trimethylgallium (TMGa), trimethylalminium (TMAl), trimethylindium (TMIn), ammonia ($NH_3$), silane ($SiH_4$), and cyclopentadienylmagnesium ($Cp_2Mg$) are used as raw materials for organometallic vapor phase epitaxy. The substrates are disposed on the susceptor 13 of the organometallic vapor phase epitaxy reactor 11, as follows:

Epitaxial substrate: Type of substrate: Substrate orientation,
E1: sapphire substrate (0001) n-GaN template: normal orientation,
E2: GaN (0001) substrate, off-angle distribution of 0.1 to 0.6 degree: normal orientation,
E3: GaN (0001) substrate, off-angle distribution of 0.1 to 0.6 degree: 90 degree-orientation with reference to the normal orientation.

In the sapphire substrate, the off angle (defined by the normal line of the primary surface of the substrate and the C-axis) on the substrate surface is well controlled within a range of about −0.1 degrees to about +0.1 degrees with reference to the off angle of the center of the sapphire substrate. Thus, the off angle is not distributed over the primary surface substantially. In the GaN (0001) substrate, although the primary surface of the substrate is fabricated such that the substrate has a surface of (0001) plane, the off angle is distributed over the primary surface. This off-angle distribution results from the fabrication of the GaN crystal.

Thermal cleaning is performed on these substrates. The cleaning is performed, for example, under a pressure of 101 kPa, while $NH_3$ and $H_2$ are supplied to the reactor at a temperature of 1050° C. The cleaning time is, for example, ten minutes.

Next, the growth of an AlGaN film is performed. TMGa, TMAl, $NH_3$, and $SiH_4$ are supplied to the reactor to form an n-type AlGaN film on the substrates. The thickness of the film is, for example, 50 nm, and the growth temperature is, for example, 1050° C. This AlGaN film can provide a microscopic flatness of its surface even when the surfaces of the GaN substrates have microscopic roughness.

After the substrate temperature in the reactor is changed to 1100° C., an GaN film is formed. The n-type GaN film is grown on the substrate while TMGa, $NH_3$, and $SiH_4$ are supplied to the reactor. The thickness of the film is, for example, 2000 nm, and the average growth rate is, for example, 4 μm/h. This GaN film functions as a cladding layer or a buffer layer.

Then, a quantum well structure is formed thereon. For the quantum well structure, an InGaN film is grown on the substrate while TMGa, TMIn, and NH$_3$ are supplied into the reactor. InGaN barrier layers and InGaN well layers are alternately deposited. The thickness of each InGaN barrier layer is, for example, 15 nm, and its composition is, for example, In$_{0.01}$Ga$_{0.99}$N. The thickness of each InGaN well layer is, for example, 3 nm, and its composition is, for example, In$_{0.14}$Ga$_{0.86}$N. The quantum well structure has six periodic units.

Next, an AlGaN film is grown thereon. A p-type AlGaN film is formed on the substrate while TMGa, TMAl, NH$_3$, and Cp$_2$Mg are supplied into the reactor. The thickness of the film is, for example, 20 nm, and the growth temperature is, for example, 1000° C. This Mg-doped AlGaN film can function as a cladding layer or an electron blocking layer. Then, a GaN film is also grown thereon. The p-type GaN film is grown on the substrate while TMGa, NH$_3$, and Cp$_2$Mg are supplied to the reactor. The thickness of the film is, for example, 50 nm, and the growth temperature is, for example, 1000° C. This Mg-doped GaN film can function as a contact layer.

Photoluminescence (PL) wavelength distributions of the epitaxial substrates E1, E2, and E3, which are formed as described above, are measured. A PL mapper was used for the measurement.

Figure 3:
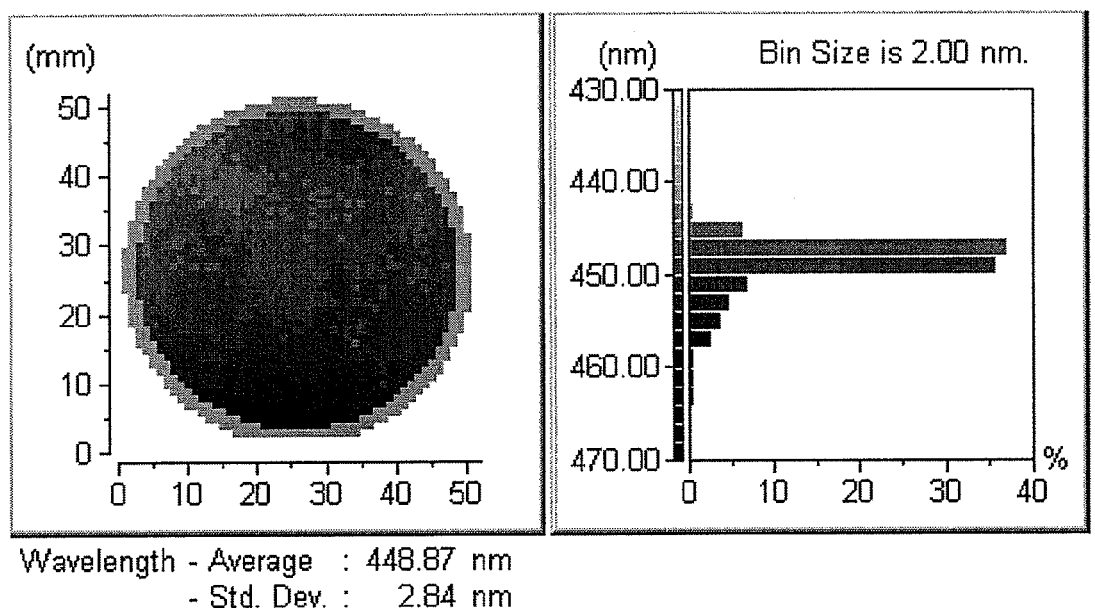
FIG. 3 shows graphs of a PL distribution, measured with a PL mapper, and the histogram of the PL distribution.

FIG. 2 is a schematic view showing the photoluminescence (PL) wavelength distribution of the epitaxial substrate E1 on the line that passes through the center point and connects points "OF" and "AOF" with each other. The off angle on the primary surface of the sapphire substrate is substantially constant, for example, 0.15 degree. FIG. 3 shows graphs of a PL distribution, measured with the PL mapper, and the histogram of the PL distribution. The histogram shows the relationship between wavelengths at the measuring points and the number of counts in each unit range of wavelength. The average PL wavelength is 448.87 nm and the standard deviation is 2.84 nm. Regardless of no off-angle distribution on the primary surface of the sapphire substrate, the PL wavelength distribution is observed. This distribution is caused by the combination of the following: a relatively large distribution of the thickness of the well layers and a relatively small distribution of the indium-content thereof.

Figure 4:
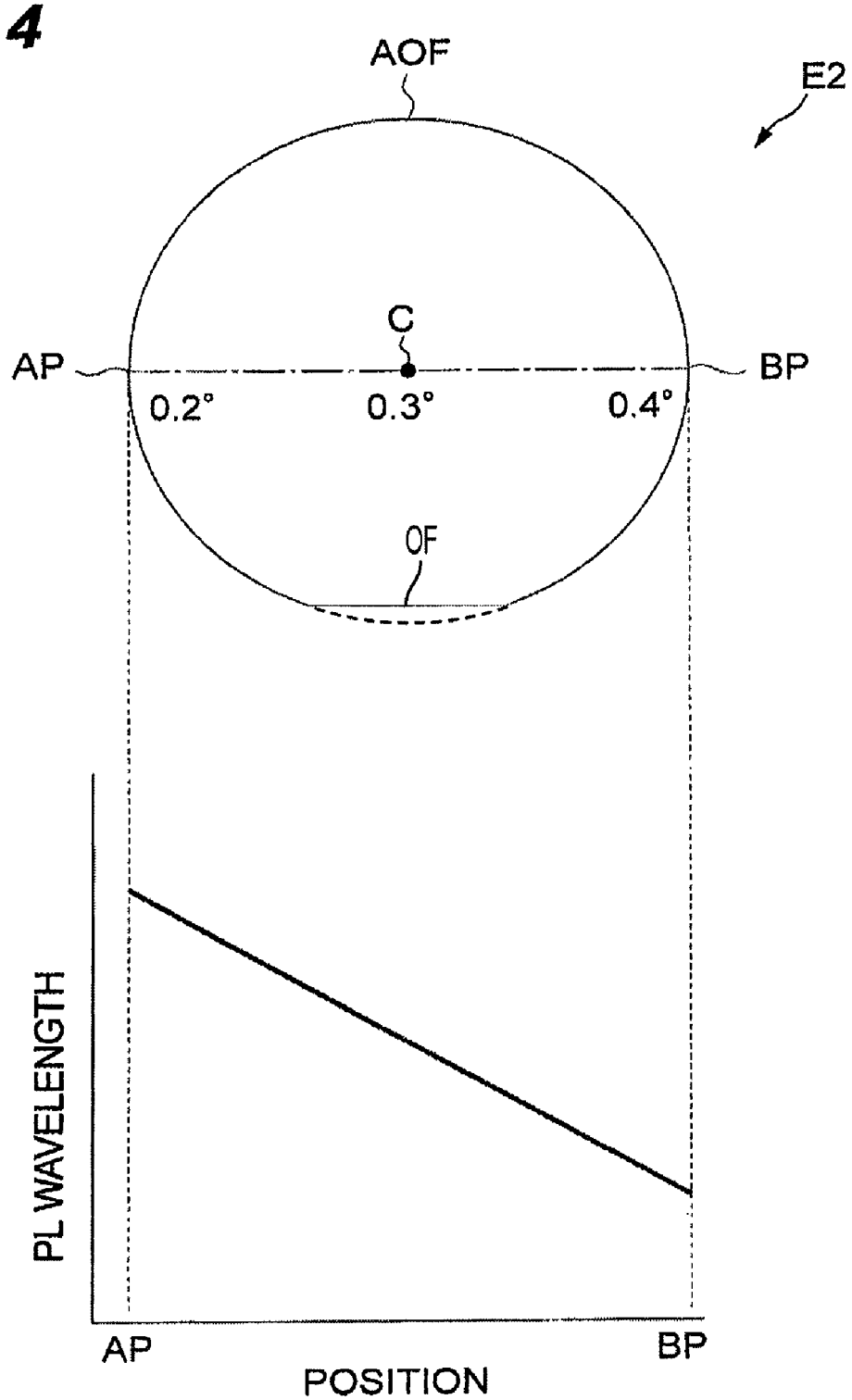
FIG. 4 is a schematic view showing a PL wavelength distribution of an epitaxial substrate "E2" on the line passing through the center point "C" and connecting the "AP" point and the "BP" point on the edge.
Figure 5:
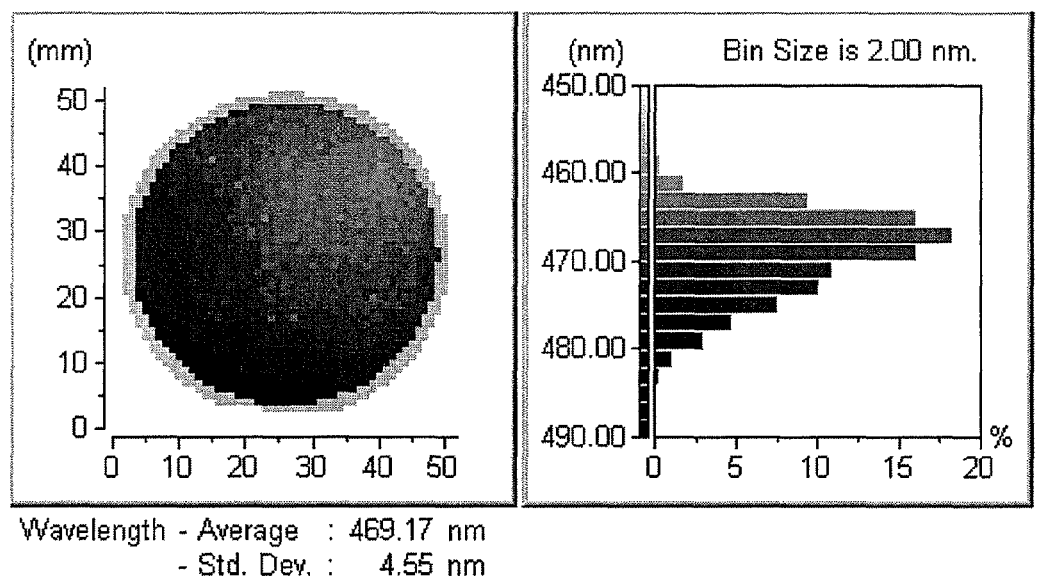
FIG. 5 shows graphs showing a PL distribution, measured by a PL mapper, and the histogram of the PL distribution.

FIG. 4 is a schematic view showing a PL wavelength distribution of the epitaxial substrate E2 on the line that passes through the center point "C" and connects points "AP" and "BP" on the edge with each other. In this embodiment, the center point "C" is at the center of a substantial circle defined by the edge of the epitaxial substrate E2. A portion of the substantial circle is shown in dashed lines due to the presence of the orientation flat OF. The off angle on the primary surface of the GaN substrate monotonically varies along this line, and has, for example, a minimum value of 0.2 degree and a maximum value of 0.4 degree. FIG. 5 shows graphs of a PL distribution, measured with the PL mapper, and the histogram of the PL distribution. The histogram shows the relationship between the wavelengths at the measuring points and the number of counts in each unit range of wavelength. The average PL wavelength is 469.17 nm and the standard deviation is 4.55 nm. The unavoidable off-angle distribution on the primary surface of the GaN substrate has an effect on the indium content of the InGaN layers in the quantum layer structure. A large off angle of the primary surface decreases the indium content of the InGaN layers. In addition to this effect, the flow of the raw materials from upstream to downstream of the flow channel has an effect on the thickness of the InGaN layer in the quantum well structure.

Figure 6:
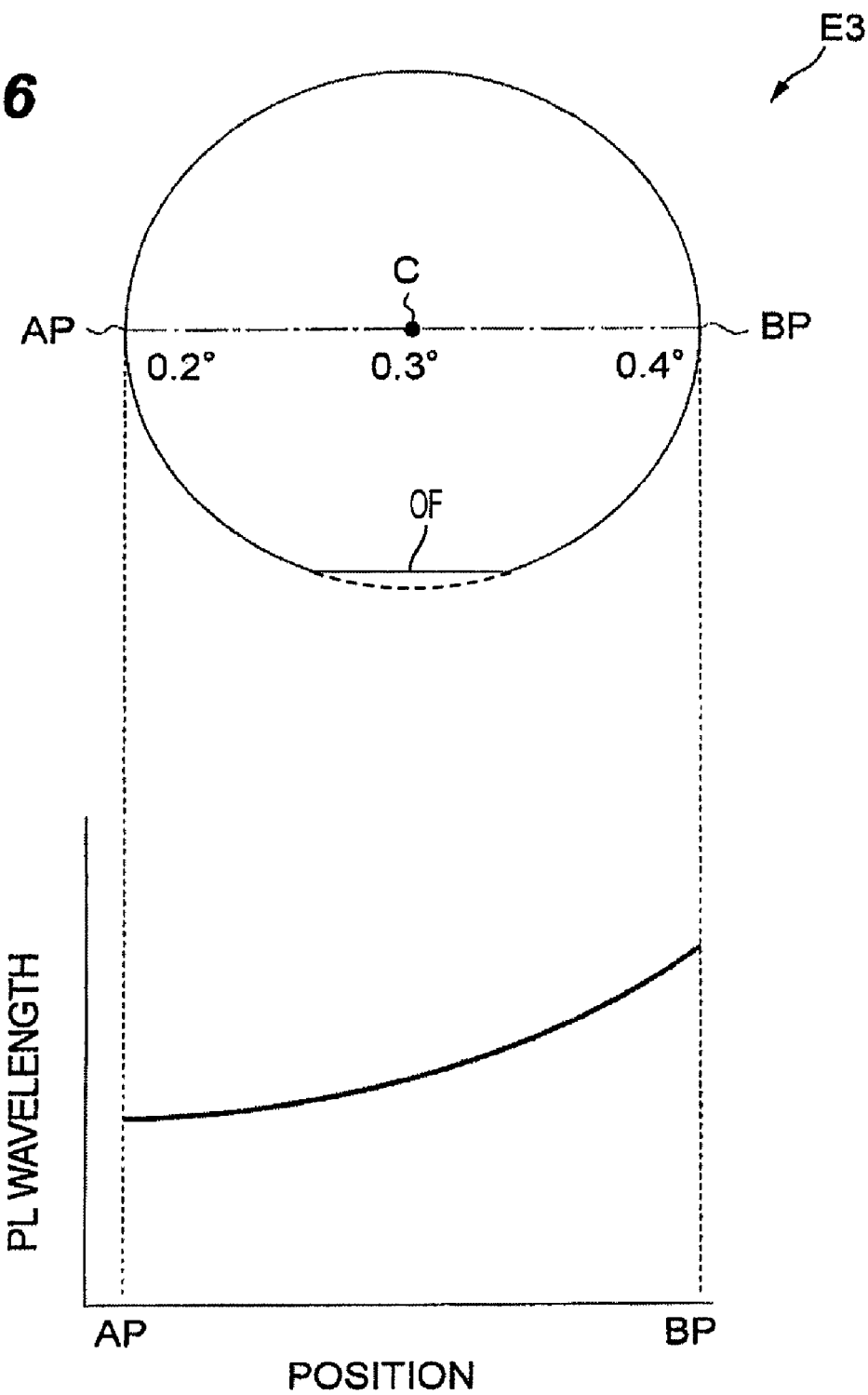
FIG. 6 is a schematic view showing a PL wavelength distribution of an epitaxial substrate "E3" on the line passing through the center point "C" and connecting the "AP" point and the "BP" point on the edge.
Figure 7:
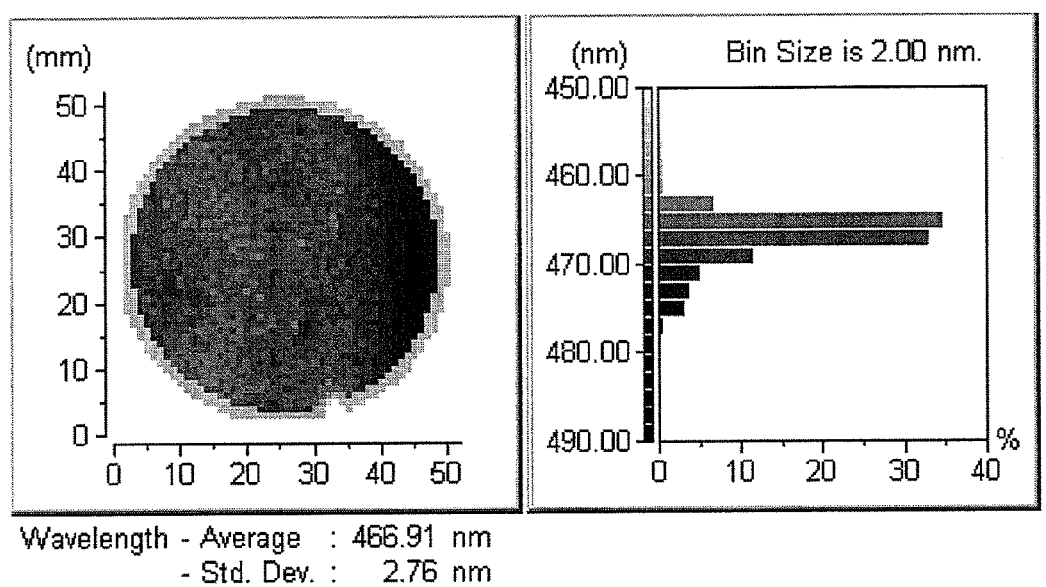
FIG. 7 shows graphs showing a PL distribution, measured by a PL mapper, and the histogram of the PL distribution.

FIG. 6 is a schematic view showing a PL wavelength distribution of the epitaxial substrate E3 on the line that passes through the center point "C" and connecting points "AP" and "BP" both on the edge. As described above with respect to the embodiment of FIG. 4, the center point "C" is at a center of the substantial circle, a portion of which is shown in dashed lines due to the presence of the orientation flat OF. The off angle on the primary surface of the GaN substrate monotonically varies along this line, and the off angle distribution has, for example, a minimum value of 0.2 degree and a maximum value of 0.4 degree. FIG. 7 shows graphs of a PL distribution, measured with the PL mapper, and the histogram of the PL distribution. The histogram shows the relationship between the wavelengths at the measuring points and the number of counts in each unit range of wavelength. The average PL wavelength is 466.91 nm and the standard deviation is 2.76 nm. The unavoidable off-angle distribution on the primary surface of the GaN substrate has an effect on the indium content of the InGaN layer in the quantum layer structure. In addition to this effect, the flow of the raw material gas from upstream to downstream of the flow channel has an effect on the thickness of the InGaN layer in the quantum well structure, thereby forming InGaN of a large thickness on a portion of the primary surface with a larger off angle.

Although the GaN substrates of the epitaxial substrates E2 and E3 have the substantially same off-angle distribution, the standard deviation of the PL wavelengths of the epitaxial substrate E3 (2.76 nm) is very small compared with the standard deviation of the PL wavelengths of the epitaxial substrate E2 (4.55 nm). This is because the off-angle distribution on the primary surface of the GaN substrate and the growth rate distribution due to the flow of the raw materials are utilized to reduce the PL wavelength distribution.

Figure 8:
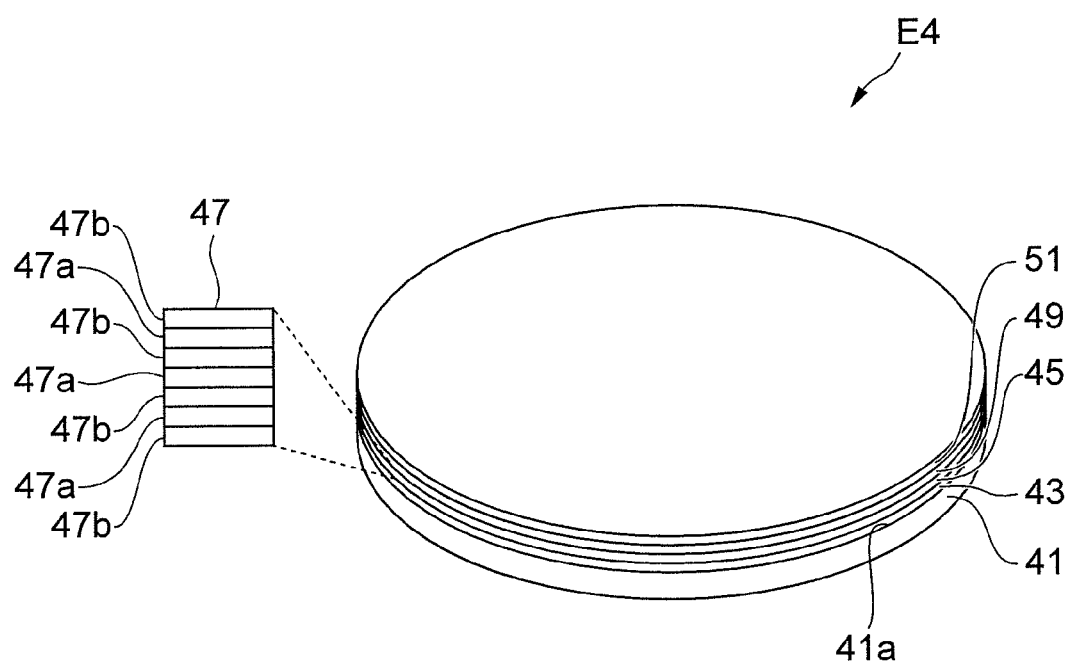
FIG. 8 is a schematic view of a gallium nitride-based epitaxial wafer used in embodiments of the present invention.

FIG. 8 is a schematic view of a gallium nitride-based epitaxial wafer for embodiments of the present invention. The gallium nitride-based epitaxial wafer E4 includes a gallium nitride substrate 41, at least one gallium nitride-based semiconductor film 43, and an active layer 45. The gallium nitride-based semiconductor film 43 is grown on a primary surface 41a of the gallium nitride substrate. The active layer 45 is grown on the gallium nitride-based semiconductor film, and includes a quantum well structure 47. The quantum well structure 47 includes well layers 47a and barrier layers 47b, which are alternately arranged. The well layers 47a are each composed of a gallium nitride-based semiconductor containing indium as a Group III constituent element. The thickness of each well layer 47a distributes entirely over the primary surface 41a. The off angle, defined by the C-axis of gallium nitride on the GaN substrate and the normal line of the primary surface of the GaN substrate, is distributed on the primary surface 41a of the substrate, and, as shown in FIG. 6, monotonically increases on the line that extends from the first point to the second point both on the edge of the primary surface 41a of the substrate. The off angle at a first point P1 (THETA 1) on the primary surface 41a of the substrate is smaller that that at a second point P2 (THETA 2) on the primary surface 41a of the substrate (THETA 2>THETA 1). In addition, the thickness D1 of the well layer 47a on the first point P1 is smaller than the thickness D2 of the well layer 47a on the second point P2 (D1<D2). The gallium nitride-based semiconductor film 43 can be, for example, an n-type cladding layer or a buffer layer. The gallium nitride-based epitaxial wafer E4 can include, if needed, at least one gallium nitride-based semiconductor film provided on the active layer 45. The gallium nitride-based semiconductor film can include, for example, a p-type cladding layer 49 and a p-type contact layer 51.

As described above, the crystal growth of a gallium nitride-based epitaxial wafer in a reactor leads to a broad emission wavelength distribution due to the effect of the flow of the raw material gas. Focusing attention on a difference between a sapphire substrate and a gallium nitride substrate, the primary surface of the sapphire substrate has a uniform crystal plane, while the off angle of the gallium nitride substrate is varied over its entire primary surface.

According to the studies conducted by the inventors, the indium content of the GaN-based semiconductor depends on the off-angle which distributes on the primary surface of the substrate. This distribution of the off angle cannot be avoided in the growth of a gallium nitride-based semiconductor. The experimental results by the inventors, however, show that, when the off angle distribution of the primary surface of a gallium nitride substrate can be controlled, the flow of the raw material gas can cancel an undesired effect of the off angle distribution.

In other words, by using the gallium nitride substrate whose off angle monotonically varies on a straight line that extends from the first point to the second point on the edge of the primary surface, this structure of the substrate can realize a well layer in which the thickness of the well layer on the first point is smaller than that of well layer on the second point when the off angle at the first point on the primary surface is smaller than that at the second point. The first point and the second point are located on different nitride semiconductor light-emitting devices.

The gallium nitride-based epitaxial wafer can provide a semiconductor device, and has a structure that can narrow an emission wavelength distribution of an active layer including a well layer provided on a gallium nitride substrate.

The direction of the line on the gallium nitride-based epitaxial wafer can be aligned to the crystal orientation <1-100> or <11-20>. Such crystal orientation is preferred in combination of the off-angle distribution and the well width distribution.

In a preferred embodiment of the gallium nitride-based epitaxial wafer, the gallium nitride substrate includes an orientation flat and a substantially circular edge. The direction of the orientation flat represents the crystal orientation <1-100> or <11-20>. In another preferred embodiment of the gallium nitride-based epitaxial wafer, the gallium nitride substrate may include a substantially circular edge, and may include a marker indicating the crystal orientation <1-100> or <11-20>.

In the gallium nitride-based epitaxial wafer, the difference between the maximum and the minimum values of the off-angle distribution along the axis passing through the center of the primary surface of the gallium nitride substrate is preferably less than or equal to 0.7 degree. Such a range is preferred in combination of the off-angle distribution and the well width distribution.

Second Embodiment

Figure 9:
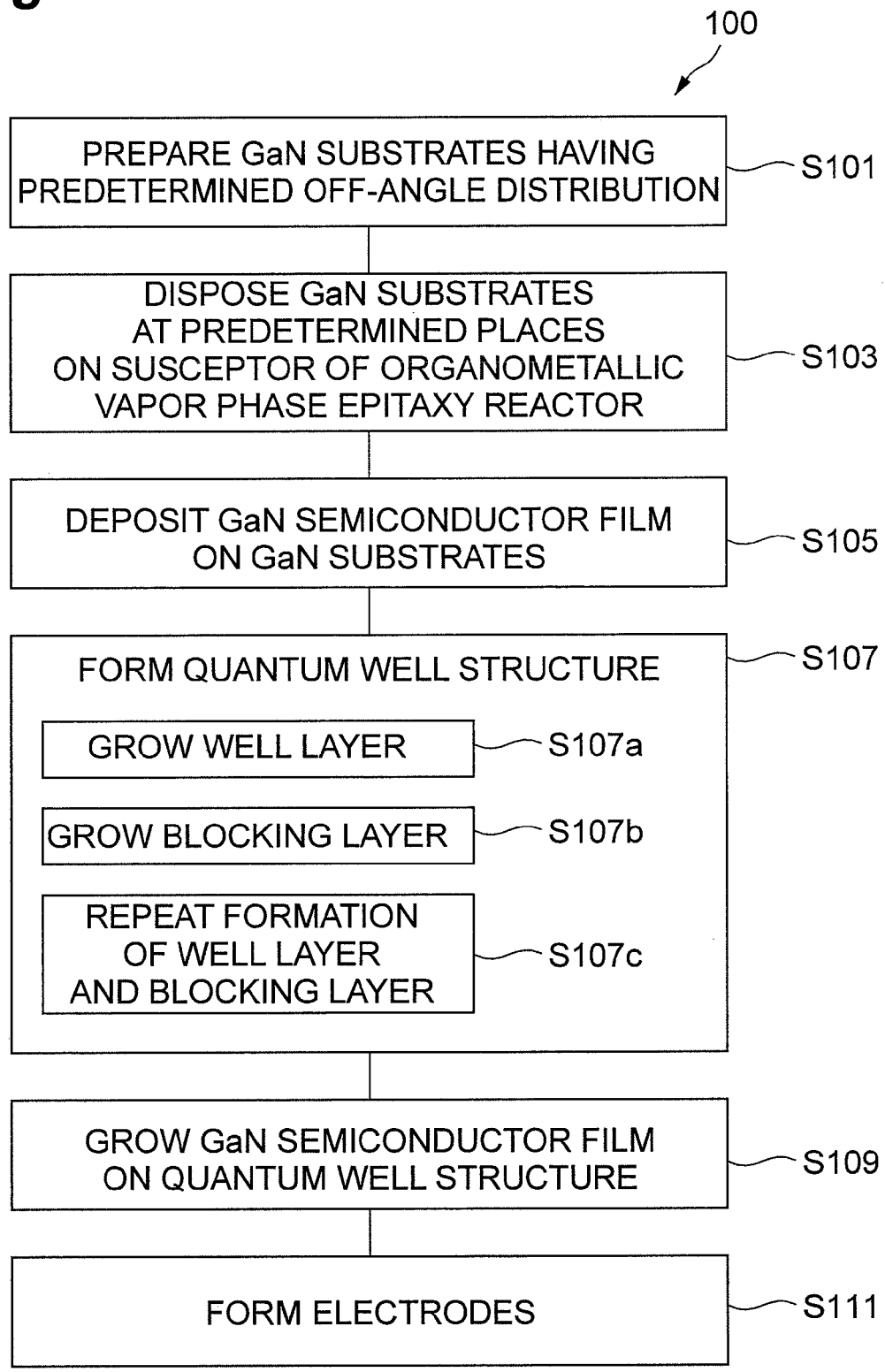
FIG. 9 is a flowchart of the primary steps of a method of fabricating a nitride semiconductor light-emitting device according to an embodiment of the present invention.

FIG. 9 is a flowchart of the primary steps of the method of fabricating a nitride semiconductor light-emitting device according to an embodiment of the present invention. With reference to the flowchart 100, in step S101, a GaN substrate having the off-angle distribution as described above is prepared. The off angle is distributed over the primary surface, and monotonically varies on the line which passes through the center point and extends from the first point to the second point both on the edge. The primary surface of the substrate does not include the single maximum point and the single minimum point that take maximum and minimum of the off angles, respectively. Equi-off-angle line, such as contour, which takes the same off-angle values, extends from the first point to the second point on the edge of the GaN substrate, and is a curve segment and/or a line segment. In an embodiment, the curvature radius of the equi-off-angle line is preferably larger than that of the outer edge of the GaN substrate. Accordingly, the off-angle of the above distribution gradually varies on the primary surface.

Figure 10:
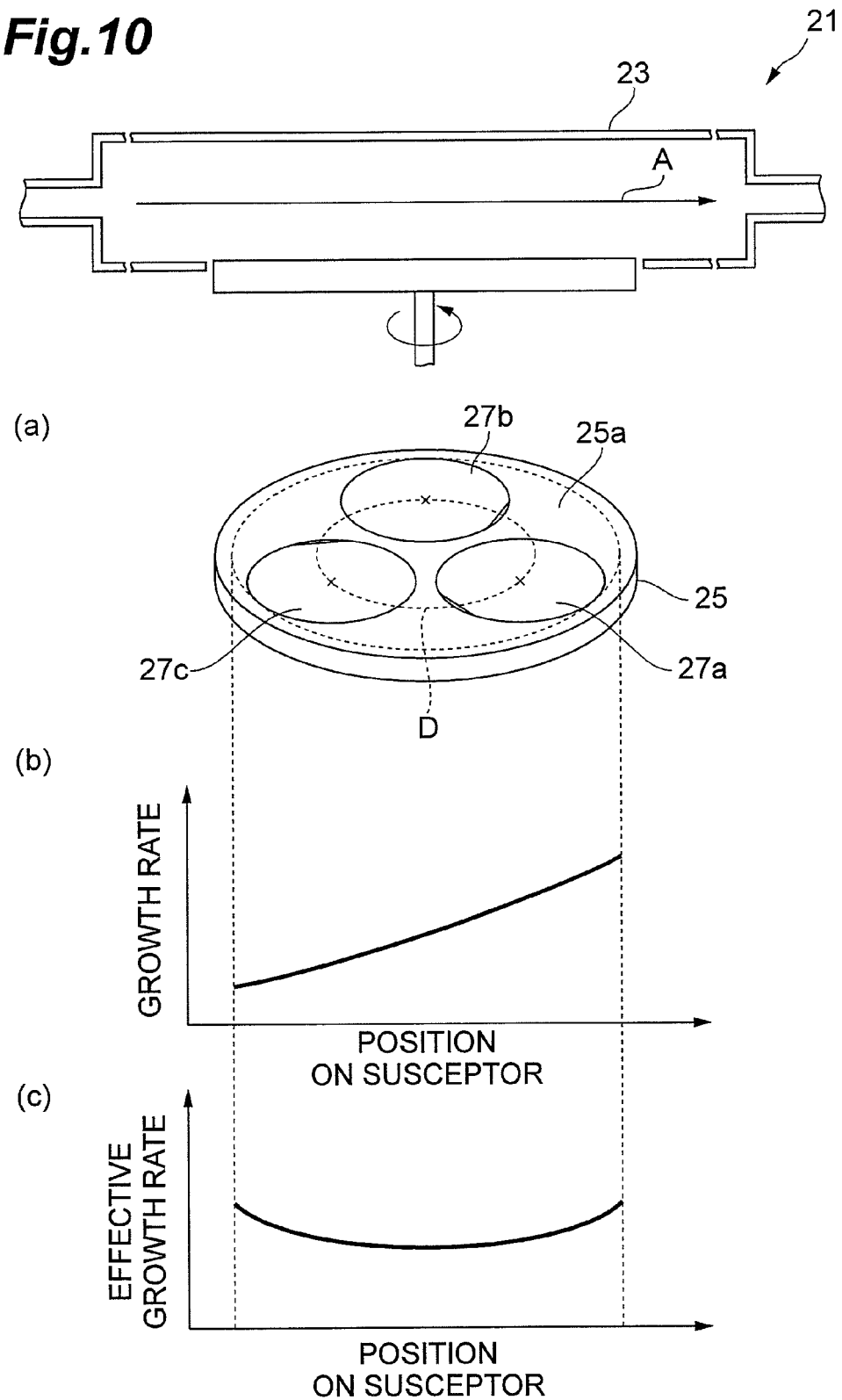
FIG. 10 shows schematic views of an organometallic vapor phase epitaxy reactor according to a preferred embodiment.

FIG. 10 shows schematic views of a reactor for an organometallic vapor phase epitaxy according to a preferred embodiment. In step S103, GaN substrates 27a, 27b, and 27c are provided at predetermined position on the susceptor in the organometallic vapor phase epitaxy reactor. As shown in Part (a) of FIG. 10, the line that extends from the first point to the second point on the edge of the primary surface of each substrate is oriented in the same direction. In the example shown in Part (a) of FIG. 10, the orientation of each of the GaN substrates 27a, 27b, and 27c is represented by the orientation of the orientation flat. The GaN substrates 27a, 27b, and 27c are oriented on the susceptor such that the each line is oriented in the direction extending from the edge of the susceptor to the center of the susceptor. The circle "D" passing through the center of the GaN substrates 27a, 27b, and 27c intersects the orientation flats.

In the organometallic vapor phase epitaxy reactor 21, raw material gas flows into a flow channel 23. The GaN substrates 27a, 27b, and 27c are disposed on the primary surface 25a of the susceptor 25. The positions of these GaN substrates are positioned by use of the guides of the primary surface 25a. The raw material gas, for example, the raw material gas to form an active layer, is flown in a direction indicated by an axis from one end to the opposite end of the primary surface 25a of the susceptor 25 of the organometallic vapor phase epitaxy reactor 21 (in the direction of the arrow A). As shown in Part (b) of FIG. 10, the flow of the raw material gas provides a difference of the growth rate of semiconductor in the direction of the flow. The orientation flats are directed in association with the growth rate distribution. That is to say, the flow of the raw material gas and the rotation of the susceptor induce a growth rate distribution of the well layer of the active layer in the direction of the flow of the raw material gas from upstream to downstream. The GaN substrates 27a, 27b, and 27c are oriented such that the first point on the edge of each substrate is directed to one region providing a larger growth rate of the distribution and the second point is directed to the other region providing a smaller growth rate of the distribution. This arrangement of the GaN substrates 27a, 27b, and 27c partially compensates for the off-angle variation in combination with the thickness distribution of the well layer due to the growth rate distribution.

The semiconductor layer is grown while rotating the susceptor 25. The rotation of the susceptor 25 can improve the uniformity of crystal growth. In addition, the rotation of the susceptor 25 can average the effect of an asymmetric or uneven flow of the raw material gas. The rotation changes the growth rate distribution shown in Part (b) of FIG. 10 to an effective growth rate distribution shown in Part (c) of FIG. 10.

The above flow of the raw material gas can be applied to the gallium nitride substrates 27a, 27b, and 27c the off angle of which monotonically varies on the line that extends from the first point to the second point on the edge of the primary surface and passes through the center of the primary surface. The line of each of the gallium nitride substrate 27a, 27b, or 27c is oriented so as to intersect the circle "D" on which the center of the GaN substrate 27a, 27b, or 27c are located. Disposing the gallium nitride substrates 27a, 27b, and 27c in such orientation on the susceptor 25 of the organometallic vapor phase epitaxy reactor 21 can reduce the effect of the off-angle distribution by use of the growth rate distribution due to the flow of the raw material gas. The off angle monotonically increases on the line extending from the first point to the second point on the edge of the primary surface of the substrate, and the thickness of the well layer increases over the line.

For example, "n" points (n: integer) are arranged in sequence on the line in each substrate, and the thickness values of the well layer at the "n" points increase monotonically on the line. In addition, "n" nitride light-emitting devices are arranged on the line, and the "n" points are located in the "n" nitride semiconductor light-emitting devices, respectively.

In step S105, a GaN-based semiconductor film is grown on each GaN substrate. The GaN-based semiconductor film is grown prior to formation of a quantum well structure. The GaN-based semiconductor film, such as an n-type semiconductor, is grown for a buffer layer or a cladding layer, for example. The semiconductor may be composed of, for example, GaN, AlGaN, or AlInGaN.

In step S107, a quantum well structure is grown thereon. In order to form the quantum well structure, a barrier layer is grown in step S107b, and then a well layer is grown in step S107a. If needed, in step S107c, the well layers and barrier layers are formed repeatedly. A gallium nitride-based semiconductor including indium as a Group III constitute element can be grown as the well layer, and this gallium nitride-based semiconductor is, for example, InGaN or AlInGaN. The barrier layer is made of, for example, GaN, InGaN, or AlInGaN. The thickness of the well layer is distributed over the primary surface due to the flow of the raw material gas, and the indium content is distributed by the effect of the off-angle distribution.

As described above, the off-angle distribution has an effect on the indium content. The effect of the off angle variation is unavoidable for growth of a gallium nitride-based semiconductor. However, when a gallium nitride substrate has a controlled distribution of the off angle on the primary surface, the growth rate change in the direction of the flow of the raw material gas can partially cancel the effect of the distribution of the off angle of the gallium nitride substrate.

Crystal growth for a gallium nitride-based epitaxial wafer in the epitaxy reactor 21 leads to a broad distribution of emission wavelength due to the effect of the flow of the raw material gas. By using the gallium nitride substrate whose the off angle monotonically varies on the specific line extending from the first point to the second point on the edge of the primary surface, the distribution of emission wavelength can be reduced by the combination of the flow of the raw material gas and the off-angle distribution over the primary surface, thereby realizing the structure in which the off angle at the first point on the primary surface of the substrate is smaller than that at the second point and the thickness of the well layer on the first point is smaller than that of well layer on the second point. Consequently, the gallium nitride-based epitaxial wafer can provide a semiconductor device, which has a structure that can narrow the emission wavelength distribution of an active layer including a well layer provided on a gallium nitride substrate.

In step S109, a GaN-based semiconductor film is grown on the quantum well structure. The GaN-based semiconductor film, such as a p-type semiconductor, is grown for a cladding layer or a contact layer, for example. The semiconductor may be composed of, for example, GaN, AlGaN, or AlInGaN.

In step S111, a first electrode, for example, an anode, is formed on the contact layer, and a second electrode, for example, a cathode is also formed on the rear surface of the GaN substrate.

Figure 11:
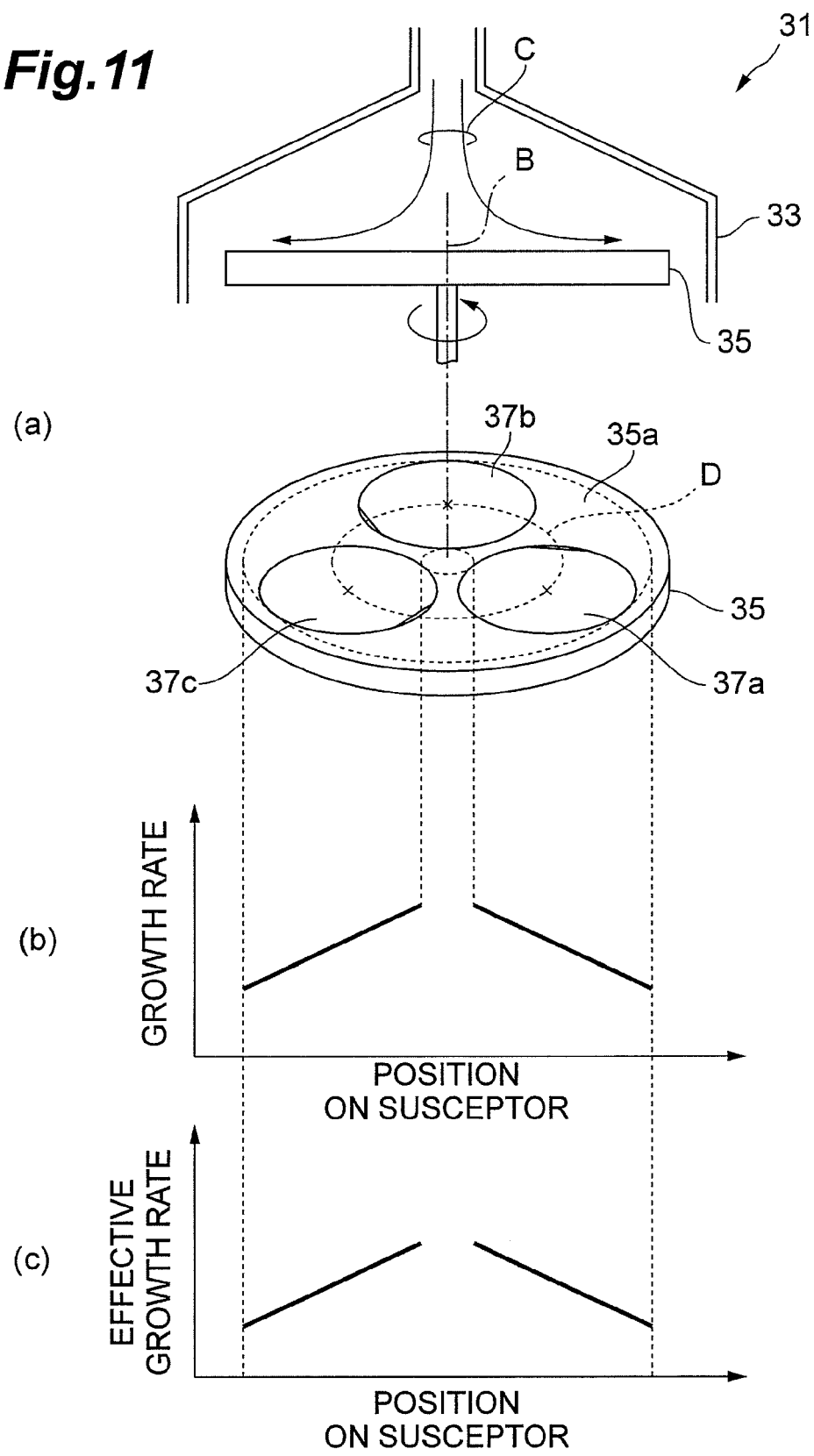
FIG. 11 includes schematic views of an organometallic vapor phase epitaxy reactor of another preferred embodiment.

FIG. 11 shows schematic views of an organometallic vapor phase epitaxy reactor of another preferred embodiment. In step S103, GaN substrates 37a, 37b, and 38c are arranged at predetermined positions on the susceptor in the organometallic vapor phase epitaxy reactor. As shown in Part (a) of FIG. 11, each line extending from the first point to the second point on the edge of the primary surface of the substrate is directed in a direction of the flow of the raw material gas. In the example shown in Part (a) of FIG. 11, the orientation of each of the GaN substrates 37a, 37b, and 37c is represented by its orientation flat. The GaN substrates 37a, 37b, and 37c are oriented on the susceptor such that centers of these substrates are located on the circle "D." The line is directed along an axis from the edge toward the center of each susceptor, and the circle "D" intersects the orientation flat.

In the organometallic vapor phase epitaxy reactor 31, raw material gas flows in a flow channel 33. The GaN substrates 37a, 37b, and 37c are disposed on the primary surface 35a of the susceptor 35. The locations of these GaN substrates are determined by use of the guides on the primary surface 35a. The raw material gas (for example, the raw material gas to form an active layer) is flown in the direction of the B-axis intersecting the primary surface 35a of the susceptor 35 (in the direction of the arrow "C"). The flow of the raw material gas forms growth rate distribution of the well layer in the direction of the flow of the raw material gas from upstream to downstream. The supply of the raw material gas also induces the growth rate distribution of the semiconductor layer that depends on the direction of the flow, as shown in Part (b) of FIG. 11. Thus, the orientation flats are oriented in association with the growth rate distribution.

The semiconductor layer is grown with the rotating susceptor 35. Rotation of the susceptor 35 can improve the uniformity of crystal growth. In addition, revolution of the substrates on the susceptor 35 can average the effect of an asymmetric or/and uneven flow of the raw material gas. The rotation changes the growth rate distribution shown in Part (b) of FIG. 11 into an effective growth rate distribution shown in Part (c) of FIG. 11.

The above flow of the raw material gas can be applied to the gallium nitride substrates 37a, 37b, and 37c whose off angle monotonically varies on the line extending from the first point to the second point on the edge of the primary surface. The susceptor 35 has a plurality of guides which are used for positioning the gallium nitride-based semiconductors, along the circle "D" defined on the primary surface 35a of the susceptor 35. Each line of the gallium nitride substrates 37a, 37b, and 37c is oriented in the direction of the line that intersects the tangent line of the circle D on the primary surface 35a of the susceptor 35.

Disposing the gallium nitride substrates 37a, 37b, and 37c in such orientation on the susceptor 35 of the organometallic vapor phase epitaxy reactor 31 can reduce the effect of the off-angle distribution in combination with the flow of the raw material gas.

Figure 12:
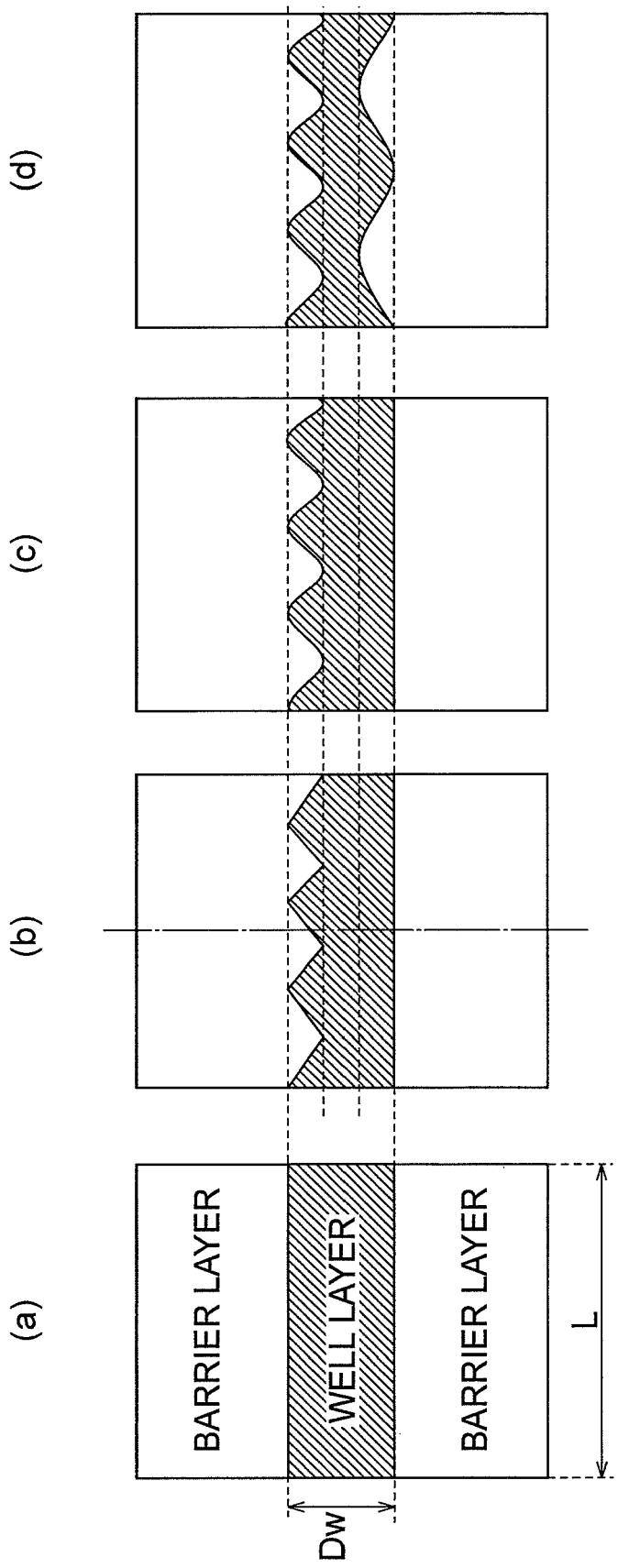
FIG. 12 includes schematic views showing various well layers provided between barrier layers.

According to observation by the inventors, the thickness of a well layer shown in a transmission electron microscopic image may spatially fluctuate under some growth conditions. FIG. 12 shows schematic views of various well layers provided between barrier layers. Part (a) of FIG. 12 shows a cross section of a well layer with substantially no thickness fluctuation, and the upper surface of the well layer is substantially flat. The thickness of the well layer "DW" is, for example, 3 nm. The thickness is equal to the value calculated from the ratio "S/L" (hereinafter referred to as "average thickness"), where symbol "S" indicates the area of the hatching region, and symbol "L" indicates the width of the well layer. With reference to Part (b) of FIG. 12, the upper surface of the well layer has a morphology of a ridge structure having a substantially triangle cross section. The average thickness of the well layer can be, for example, S/L=2.5 nm. With reference to Part (c) of FIG. 12, the upper surface of the relevant well layer has a morphology of a ridge structure having a substantially waveform in the cross section. The average thickness of the well layer can be, for example, S/L=2.5 nm. With reference to Part (d) of FIG. 12, the upper surface of the well layer has a morphology of a ridge structure having a substantially waveform in the cross section, and the upper surface of the barrier layer below the well layer has a morphology of a ridge structure having a substantially waveform cross section. The average thickness of the well layer is, for example, S/L=2 nm. According to the studies by the inventors, a film thickness variation due to the growth rate distribution has an effect on such average thickness. The average of the thickness of the InGaN layer is not limited to this method, and another averaging method can be applied thereto.

Figure 13:
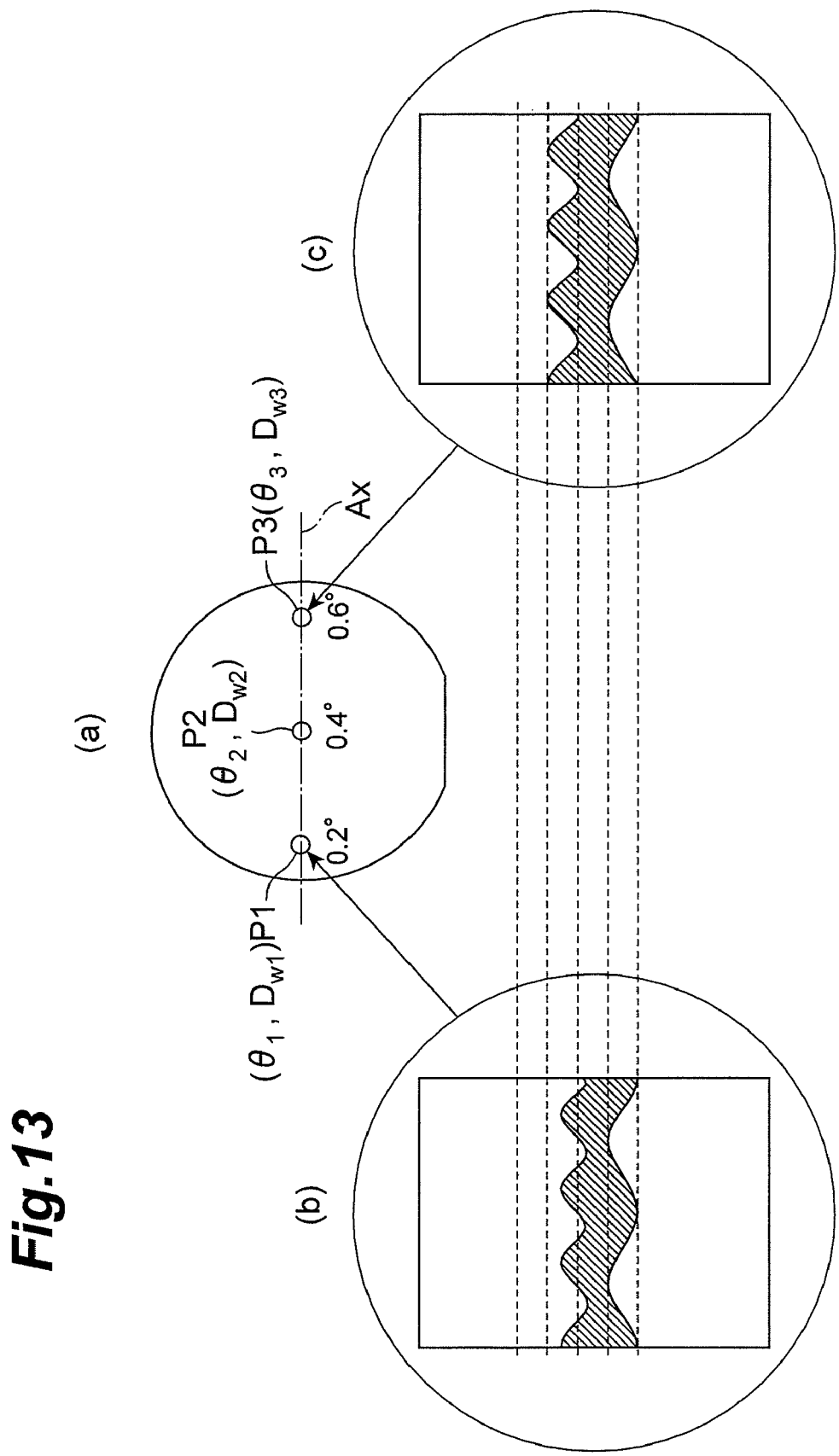
FIG. 13 shows schematic views of a wafer having an off-angle distribution and a thickness distribution of a well layer on an axis passing through the center of the wafer.

Part (a) of FIG. 13 shows a wafer having an off-angle distribution on an axis passing through the center of the wafer. The off angles at the three points P1, P2, and P3 on the axis Ax are $\theta_1$=0.2 degree, $\theta_2$=0.4 degree, and $\theta_3$=0.6 degree, respectively. In the transmission electron microscopic image, a well layer schematically illustrated in Part (b) of FIG. 13 was observed around the point P1, and a well layer schematically illustrated in Part (c) of FIG. 13 was observed around the point P3. The indium content in the InGaN well layer around the point P1 is larger that that of the InGaN well layer around the point P3. According to the explanation with reference to FIG. 12, the average thicknesses "DW1," "DW2," and "DW3" of the well layer at the points P1, P2, and P3 on the axis Ax are 1.5 nm, 1.8 nm, and 2 nm, respectively. In other words, the average thicknesses "DW1," "DW2," and "DW3" monotonically increase on the axis Ax. In addition, the indium content in the InGaN layer monotonically decreases in the order of the points P1, P2, and P3. Consequently, the explanation in this embodiment applies the relationship between the indium content in the InGaN layer and the average thickness of the InGaN layer in terms of the average, even if the thickness of the well layer has spatial fluctuation.

A specific procedure of calculating the average thickness value of a well layer by use of an area obtained from a transmission electron microscopic image is described below. The transmission electron microscopic image is read into a processor such as a computer. The microscopic image may preferably be a scanning transmission electron microscopic image. Part (a) of FIG. 14 shows an image displayed on the processor. Contrast of the microscopic image is adjusted to produce a high-contrast image. The high-contrast image is binarized, and then is formed in reverse video, if needed. In Part (b) of FIG. 14, an image with black represents a well layer. In the processor, a region to which average calculation is applied is selected on the display and the calculation of the area is performed. The width "L" of the well layer is determined by selection of the calculation region, and the average thickness of the film (S/L) is obtained from the calculated area "S" and the width "L."

Figure 15:
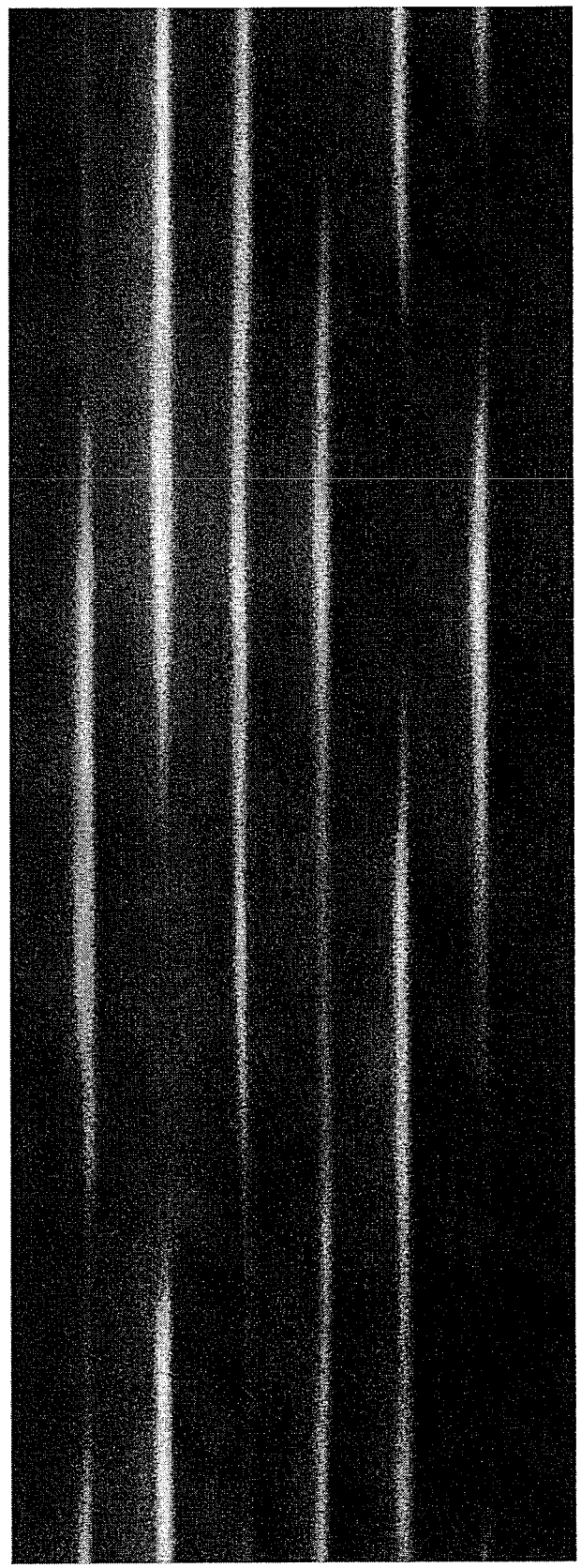
FIG. 15 shows a transmission electron microscopic image of a multiple quantum well structure of an epitaxial wafer.
Figure 16:
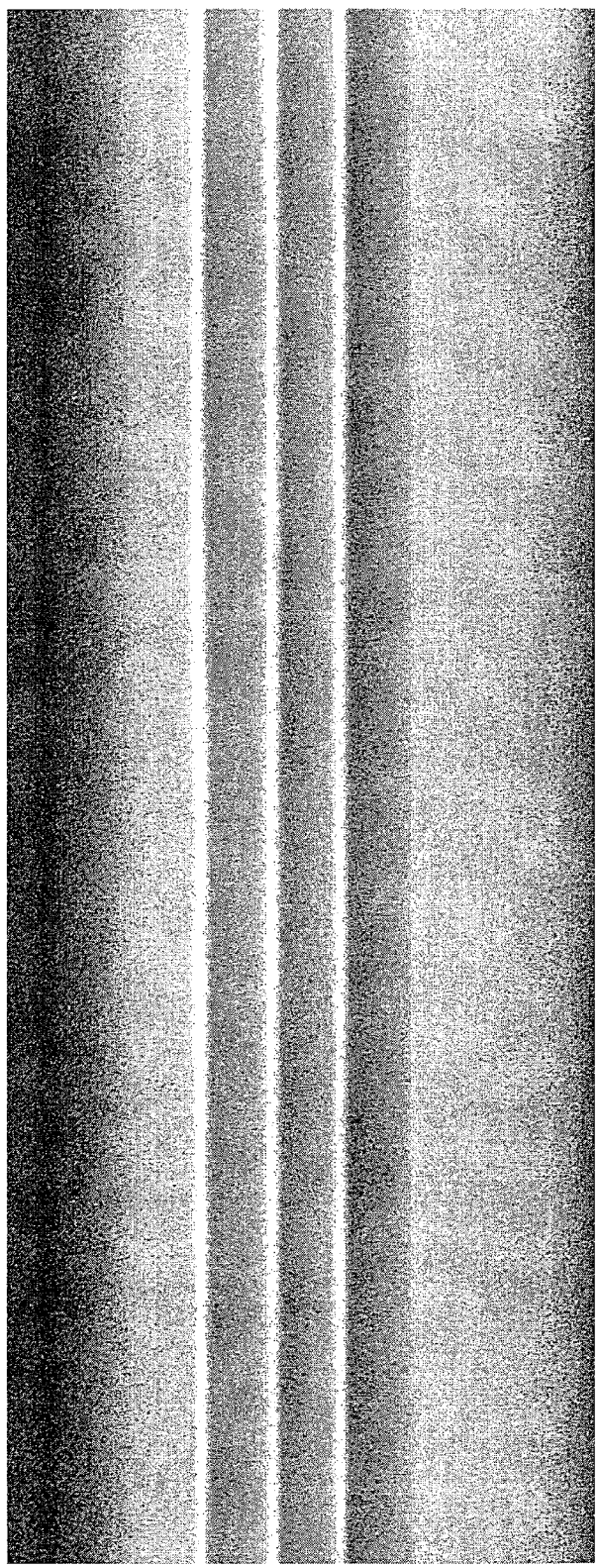
FIG. 16 shows a transmission electron microscopic image of a multiple quantum well structure of another epitaxial wafer.
Figure 17:
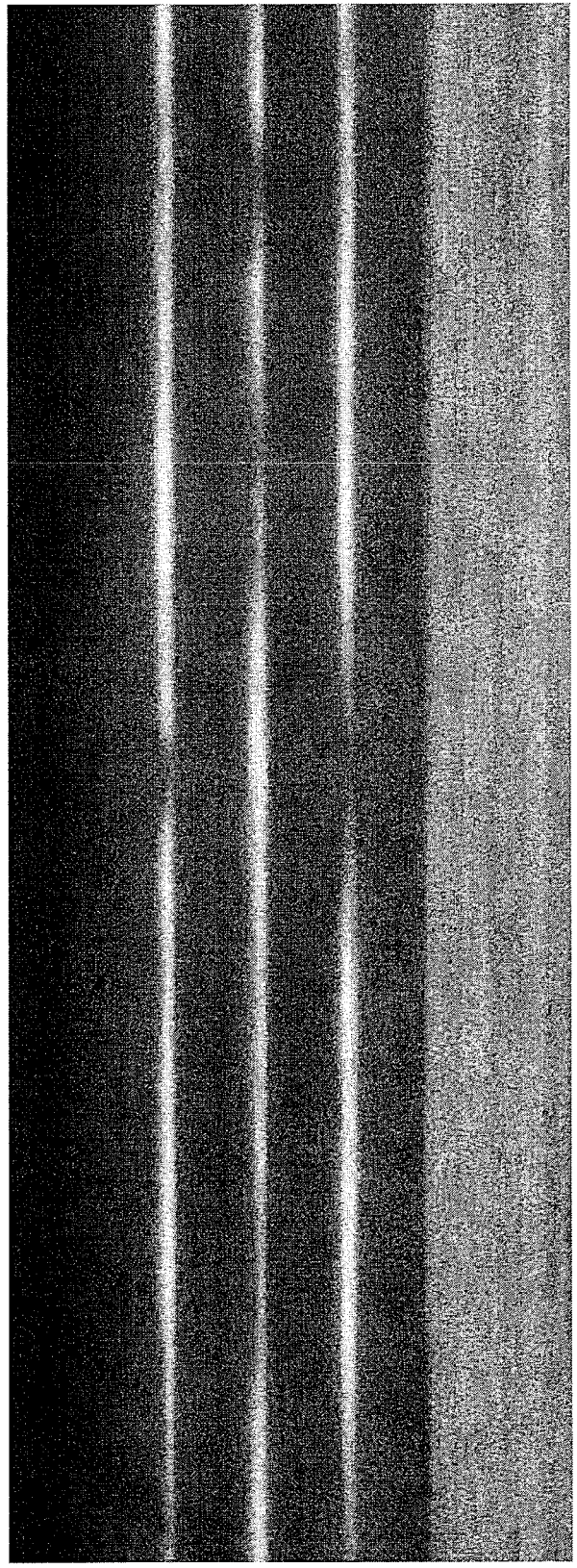
FIG. 17 shows a transmission electron microscopic image of a multiple quantum well structure of still another epitaxial wafer.
Figure 18:
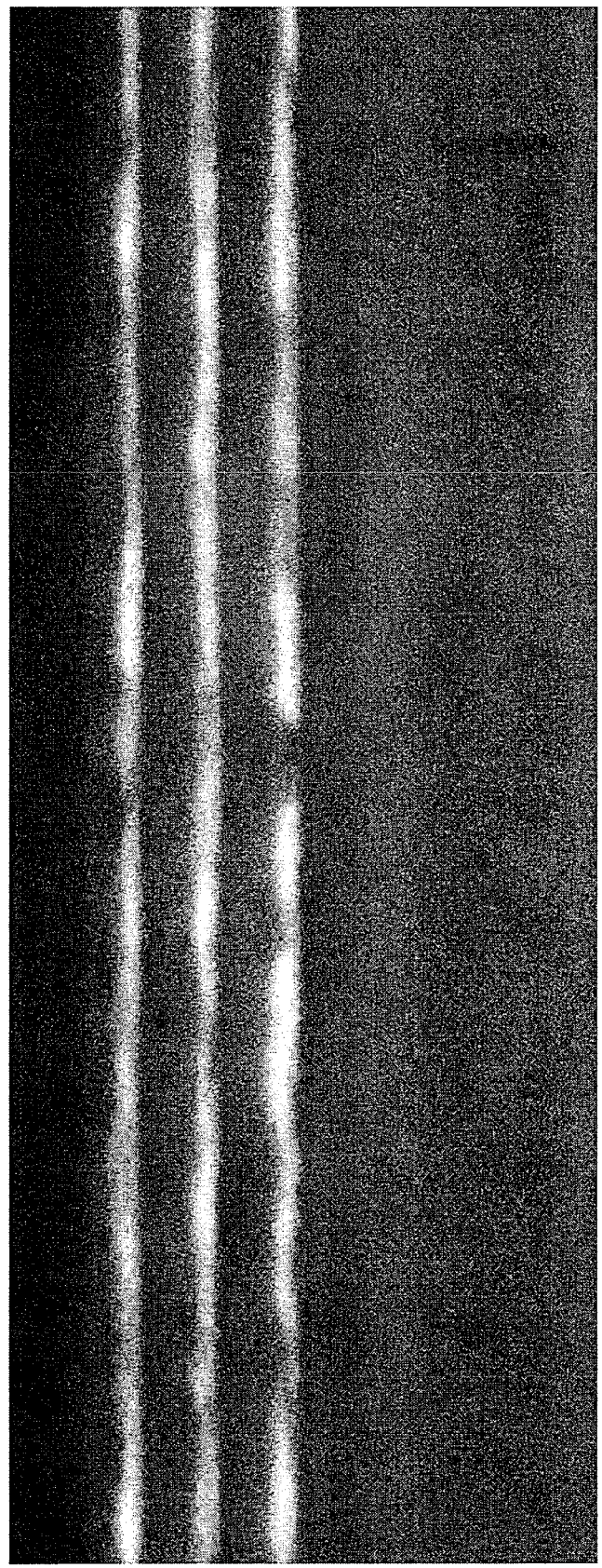
FIG. 18 shows a transmission electron microscopic image of a multiple quantum well structure of yet another epitaxial wafer.
Figure 19:
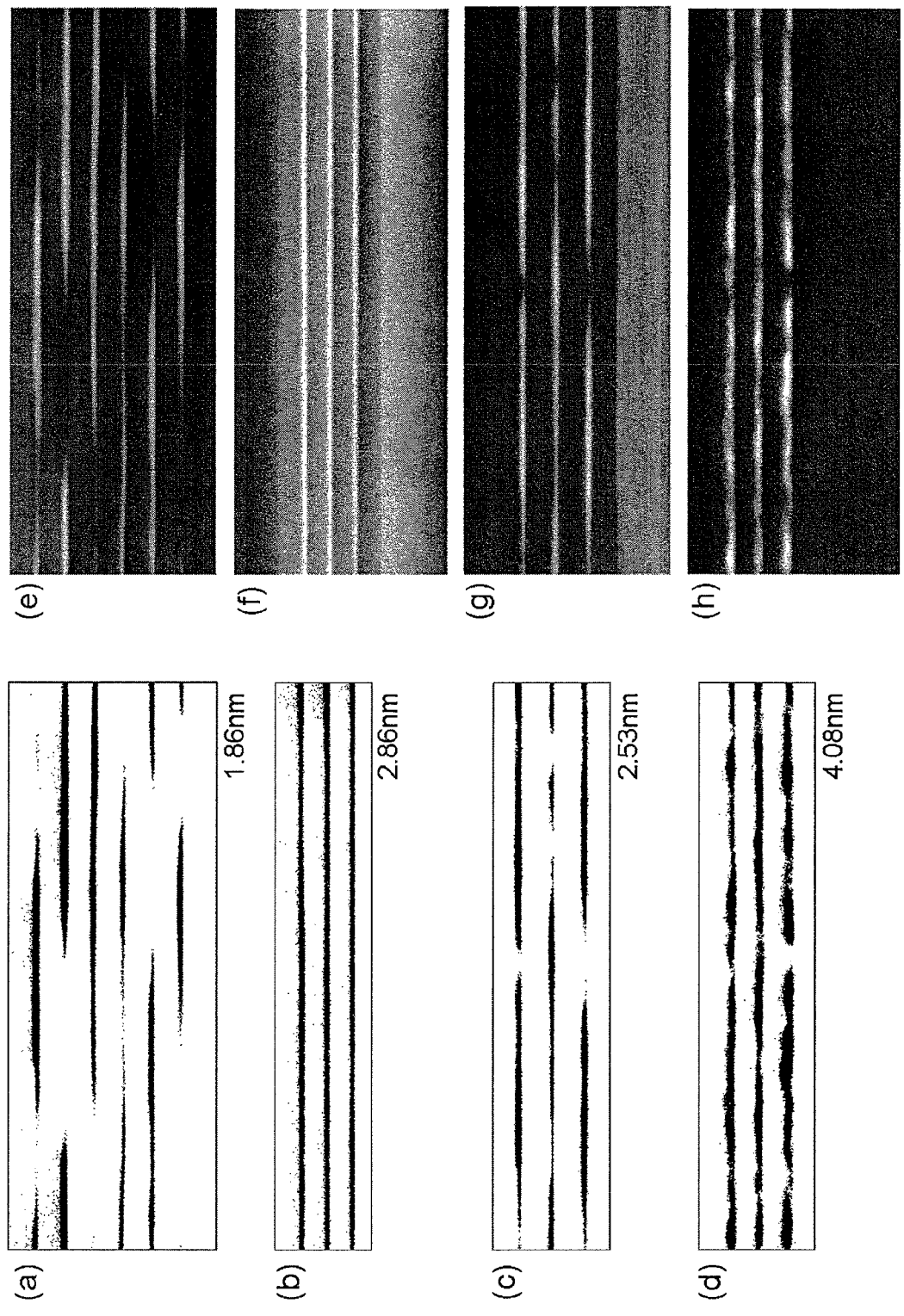
FIG. 19 shows transmission electron microscopic images and their binarized images of multiple quantum well structures of epitaxial wafers.

FIGS. 15 to 18 show transmission electron microscopic images of multiple quantum well structures of epitaxial wafers. The microscopic image in FIG. 15 shows a well layer with a thickness fluctuation. According to visual measurement, the maximum thickness of the film was 4.4 nm and the minimum thickness of the film was 0 nm. The average thickness calculated with the processor was 1.86 nm. The microscopic image in FIG. 16 shows a well layer with a substantially uniform thickness. According to visual measurement, the thickness of the film was 2.6 nm. The average thickness calculated with the processor was 2.86 nm. The microscopic image in FIG. 17 shows a well layer having a thickness fluctuation. According to visual measurement, the maximum thickness of the film was 3.3 nm and the minimum thickness of the film was 0 nm. The average thickness calculated with the processor was 2.53 nm. The microscopic image in FIG. 18 shows a well layer with a thickness fluctuation. According to visual measurement, the maximum thickness of the film was 4.5 nm and the minimum thickness of the film was 0 nm. The average thickness calculated with the processor was 4.08 nm. Parts (a) through (d) of FIG. 19 show binarized images of FIGS. 15 through 18, respectively. Parts (e) through (f) of FIG. 19 show the original images before binarization to clarify correspondence to their binarized images. FIGS. 15 through 18 are magnified images of Parts (e) through (f) of FIG. 19, respectively.

As described above, the average thickness are calculated through acquisition of an image into the processor, adjustment of its contrast, binarization, selection of a region for average calculation, and calculation of the area.

As described above, the embodiments of the present invention provide a method of fabricating an epitaxial wafer for a gallium nitride-based semiconductor light-emitting device having a structure that can narrow a distribution of the emission wavelength of an active layer including a well layer provided on a gallium nitride substrate. The embodiments of the present invention also provide a gallium nitride-based epitaxial wafer for such a semiconductor device.

Although the principle of the present invention has been illustrated and described by the preferred embodiments, it should be noted that persons skilled in the art can modify the arrangements and the details of the present invention without departing from the principle. The present invention is not limited to any particular configuration disclosed in the embodiments. In the embodiments, three substrates are disposed on the susceptor. However, arrangement of four or more substrates on the susceptor can be applied to the present invention. It is therefore understood that the appended claims are intended to cover all modifications and changes as fall within the true spirit and scope of the invention.

The invention claimed is:

1. A gallium nitride-based epitaxial wafer for a nitride light-emitting device, comprising:
   a gallium nitride substrate having a primary surface;
   at least one gallium nitride-based semiconductor film provided on the primary surface of the gallium nitride substrate; and,
   an active layer provided on the gallium nitride-based semiconductor film, the active layer having a quantum well structure;
   the active layer including a well layer of a gallium nitride-based semiconductor, the gallium nitride-based semiconductor containing indium as a Group III element, a normal line of the primary surface and a C-axis of the gallium nitride substrate forming an off angle with each other, the off angle being distributed on the primary surface, the off angle monotonically increasing on a line, the line extending from one point to another point through a center point of the primary surface of the gallium nitride substrate, the one point and the another point being on an edge of the primary surface, indium contents of the well layer defined at n points (n: integer) on the line monotonically decreasing in a direction from the one point to the another point, and the thickness values of the well layer defined at the n points monotonically increasing in the direction.

2. The gallium nitride-based epitaxial wafer according to claim 1, wherein the primary surface has a number of areas defined on the line for an arrangement of nitride light-emitting devices, and each of the areas includes at least one of the n points.

3. The gallium nitride-based epitaxial wafer according to claim 1, wherein the thickness is defined as an average at each of the n points, and the average is defined as S/L, where symbol "L" represents a predetermined length in a cross sectional image of the well layer and the predetermined length is defined in the cross sectional image in a direction perpendicular to an axis extending from the gallium nitride substrate to the active layer, and symbol "S" represents a planer dimension of the well layer defined in the predetermined length "L" in the cross sectional image.

4. The gallium nitride-based epitaxial wafer according to claim 1, wherein an off angle at a first point on the primary surface is smaller than an off angle at a second point on the primary surface, a thickness of the well layer at the first point on the primary surface is smaller than a thickness of the well layer at the second point on the primary surface, and the first and second points are located in the areas for separate nitride light-emitting devices.

5. The gallium nitride-based epitaxial wafer according to claim 1, wherein the line is defined such that the primary surface is perpendicular to a reference plane defined by the line and one of crystal axis <1-100> and <11-20>.

6. The gallium nitride-based epitaxial wafer according to of claim 1, wherein the gallium nitride wafer includes an orientation flat and a substantially circular edge defined by the center point, and the direction of the orientation flat is associated with one of the crystal orientation <1-100> and <11-20>.

7. The gallium nitride-based epitaxial wafer according to claim 1, wherein the gallium nitride wafer includes an edge of a substantial circle, the center point of the primary surface is at a center of the substantial circle, the gallium nitride wafer includes a marker, and the marker represents one of crystal orientation <1-100> and <11-20>.

8. The gallium nitride-based epitaxial wafer according to claim 1, wherein a difference between a maximum value and a minimum value of the off-angle on the line passing through the center of the primary surface of the gallium nitride substrate is less than or equal to 0.7 degree.

9. A method of fabricating an epitaxial wafer for a nitride light-emitting device, comprising the steps of:
  growing a first gallium nitride-based semiconductor film on a primary surface of each of a plurality of gallium nitride substrates, the gallium nitride substrates being located on a susceptor of an organometallic vapor phase epitaxy reactor;
  growing an active layer on the first gallium nitride-based semiconductor film in the organometallic vapor phase epitaxy reactor while supplying raw material gas, the active layer having a quantum well structure; and
  growing a second gallium nitride-based semiconductor film on the active layer in the organometallic vapor phase epitaxy reactor,
  one of the first gallium nitride-based semiconductor film and the second gallium nitride-based semiconductor film being doped with n-type dopant, another of the first gallium nitride-based semiconductor film and the second gallium nitride-based semiconductor film being doped with p-type dopant, the active layer including a well layer of a gallium nitride-based semiconductor, the gallium nitride-based semiconductor containing indium as a Group III element, a normal line of the primary surface and a C-axis of each gallium nitride substrate forming an off angle with each other, the off angle being distributed over the primary surface, and the off angle monotonically varying along a line, the line extending from one point to another point through a center point of the primary surface of the gallium nitride substrate, the one point and the another point being on an edge of the primary surface, the off angle at the one point on the edge being larger than that at the another point of the primary surface, the well layer being grown with rotation of the susceptor, the rotation of the susceptor and flow of raw material gas along a flow axis from upstream to downstream of the raw material gas causing a distribution of a growth rate of the well layer, and the distribution of the growth rate having a large growth rate at the one point, and the distribution of the growth rate having a small growth rate at the another point.

10. The method according to claim 9, wherein the thickness is defined as an average in each of the n points, and the average is defined as S/L, where symbol "L" represents a predetermined length in a cross sectional image of the well layer and the predetermined length is defined in a direction perpendicular to an axis extending from the gallium nitride substrate to the active layer, and symbol "S" represents a planer dimension of the well layer defined in the predetermined length "L" in the cross sectional image.

11. The method according to claim 9, wherein an off angle at a first point on the primary surface is smaller than an off angle at a second point on the primary surface, a thickness of the well layer at the first point on the primary surface is smaller than a thickness of the well layer at the second point on the primary surface, and the first and second points are located in separate nitride light-emitting devices.

12. The method according to claim 9, wherein the raw material gas for forming the active layer flows in a direction of traverse from one end to an opposite end of the primary surface of the susceptor in the organometallic vapor phase epitaxy reactor.

13. The method according to claim 9, wherein the raw material gas to form the active layer is flown in a direction of an axis intersecting the primary surface of the susceptor.

14. The method according to claim 9, wherein the susceptor includes a plurality of wafer guides for positioning gallium nitride substrates and the wafer guides are arranged on a circumference defined on the primary surface of the susceptor, and the line of each gallium nitride substrate is oriented in a direction intersecting a tangent line of the circumference on the primary surface of the susceptor.

15. The method according to claim 9, further comprising the step of loading the gallium nitride substrates on the susceptor.

* * * * *